United States Patent
Cao et al.

(10) Patent No.: US 9,654,101 B2
(45) Date of Patent: May 16, 2017

(54) INTEGRATED CIRCUIT POWER RAIL MULTIPLEXING

(71) Applicant: QUALCOMM Incorporated, San Diego, CA (US)

(72) Inventors: Lipeng Cao, La Jolla, CA (US); Divjyot Bhan, Encinitas, CA (US); Ramaprasath Vilangudipitchai, San Diego, CA (US); Dorav Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 119 days.

(21) Appl. No.: 14/814,409

(22) Filed: Jul. 30, 2015

(65) Prior Publication Data

US 2017/0033796 A1 Feb. 2, 2017

(51) Int. Cl.
*H03K 17/693* (2006.01)
*H03K 19/00* (2006.01)

(52) U.S. Cl.
CPC ....... *H03K 17/693* (2013.01); *H03K 19/0016* (2013.01)

(58) Field of Classification Search
CPC .................. H03K 17/693; H03K 19/0016
USPC .................................................. 327/365–508
See application file for complete search history.

(56) References Cited

U.S. PATENT DOCUMENTS

| | | | |
|---|---|---|---|
| 6,566,935 B1 | 5/2003 | Renous | |
| 6,593,796 B1 * | 7/2003 | Willis | H02M 7/48 327/408 |
| 7,005,911 B1 * | 2/2006 | Om'mani | H03K 17/063 327/408 |
| 7,746,154 B2 * | 6/2010 | Merandat | H03K 17/005 327/407 |
| 8,004,111 B2 | 8/2011 | Potter et al. | |
| 8,143,934 B1 * | 3/2012 | Shutt | H03K 17/063 327/404 |
| 8,436,678 B1 | 5/2013 | Wang et al. | |

(Continued)

OTHER PUBLICATIONS

Cheng W.H., et al., "Dynamic Voltage and Frequency Scaling Circuits with Two Supply Voltages", IEEE International Symposium on Circuits and Systems, ISCAS 2008, Piscataway, NJ, USA, May 18, 2008 (May 18, 2008), pp. 1236-1239, XP031392203, ISBN: 978-1-4244-1683-7.

(Continued)

*Primary Examiner* — Brandon S Cole
(74) *Attorney, Agent, or Firm* — Chui-kiu Teresa Wong; Kenneth Vu

(57) ABSTRACT

An integrated circuit (IC) is disclosed herein for power management through power rail multiplexing. In an example aspect, an IC includes a first power rail, a second power rail, and a load power rail. The IC also includes a first set of transistors including first transistors that are coupled to the first power rail and a second set of transistors including second transistors that are coupled to the second power rail. The IC further includes power-multiplexer circuitry that is configured to switch access to power for the load power rail from the first power rail to the second power rail by sequentially turning off the first transistors of the first set of transistors and then sequentially turning on the second transistors of the second set of transistors.

24 Claims, 18 Drawing Sheets

(56) References Cited

U.S. PATENT DOCUMENTS

| | | | | |
|---|---|---|---|---|
| 8,866,337 | B2* | 10/2014 | Schindler | H02J 7/0065 307/31 |
| 9,083,342 | B2* | 7/2015 | Huang | H03K 17/223 |
| 9,112,452 | B1* | 8/2015 | Khlat | H03F 3/04 |
| 2007/0285142 | A1 | 12/2007 | Shin et al. | |
| 2008/0074166 | A1* | 3/2008 | Merandat | H03K 17/005 327/407 |
| 2008/0238964 | A1* | 10/2008 | Umeda | B41J 29/393 347/10 |
| 2011/0188334 | A1* | 8/2011 | Kang | H01H 37/76 365/226 |
| 2012/0236444 | A1* | 9/2012 | Srivastava | H01L 27/0285 361/56 |
| 2013/0328613 | A1* | 12/2013 | Kay | H03K 17/687 327/427 |
| 2015/0028941 | A1 | 1/2015 | Flores et al. | |
| 2015/0035358 | A1* | 2/2015 | Linkhart | H02J 3/006 307/23 |
| 2015/0153818 | A1 | 6/2015 | Jeon | |

OTHER PUBLICATIONS

International Search Report and Written Opinion—PCT/US2016/033910—ISA/EPO—Oct. 27, 2016.

Royannez P., et al., "90nm Low Leakage SoC Design Techniques for Wireless Applications", Solid-State Circuits Conference, Digest of Technical Papers ISSCC, IEEE International, San Francisco, CA, USA Feb. 6-10, 2005, IEEE, Piscataway, NJ, USA, Jan. 1, 2005, vol. 1, pp. 138, 139 & 589, XP031173684, DOI: 10.1109/ISSCC.2005.1493907, ISBN: 978-0-7803-8904-5.

Truong D.N., et al., "A 167-Processor Computational Platform in 65 nm CMOS", IEEE Journal of Solid-State Circuits, IEEE Service Center, Piscataway, NJ, USA, vol. 44, No. 4, Apr. 1, 2009 (Apr. 1, 2009), pp. 1130-1144, XP011254308, ISSN: 0018-9200, DOI: 10.1109/JSSC.2009.2013772.

Di L., et al., "Power Switch Characterization for Fine-Grained Dynamic Voltage Scaling", IEEE International Conference on Computer Design, ICCD, Piscataway, NJ, USA, Oct. 12, 2008 (Oct. 12, 2008), pp. 605-611, XP031407625, ISBN: 978-1-4244-2657-7.

Partial International Search Report—PCT/US2016/033910—ISA/EPO—Aug. 12, 2016.

Schweizer T., et al., "Low Energy Voltage Dithering in Dual V DD Circuits", Sep. 9, 2009 (Sep. 9, 2009), Integrated Circuit and System Design, Power and Timing Modeling, Optimization and Simulation, Springer Berlin Heidelberg, Berlin, Heidelberg, pp. 237-246, XP019138405, ISBN: 978-3-642-11801-2.

Shi K., et al., "A Wakeup Rush Current and Charge-Up Time Analysis Method for Programmable Power-Gating Designs", IEEE International SOC Conference, Piscataway, NJ, USA, Sep. 26, 2007 (Sep. 26, 2007), pp. 163-165, XP031274150, ISBN: 978-1-4244-1592-2.

* cited by examiner

INTEGRATED CIRCUIT POWER RAIL MULTIPLEXING

BACKGROUND

Field of the Disclosure

This disclosure relates generally to power management of integrated circuits (ICs) in electronic devices and, more specifically, to switching a source of power for a circuit to reduce power consumption.

Description of Related Art

Power consumption of electronic devices is an increasingly important concern in the design and use of the electronic devices. From a global perspective, a multitude of electronic devices available for businesses and consumers consume significant amounts of power. Accordingly, efforts are made to lower the power consumption of electronic devices to help conserve the earth's resources and corresponding costs to the businesses and consumers. From an individual perspective, the prevalence of personal computing devices that are powered by batteries continues to increase. The less energy that is consumed by a portable battery-powered electronic device, the longer the portable device may operate without recharging the battery. Lower energy consumption also enables the use of smaller batteries and therefore the adoption of smaller and thinner form factors for portable electronic devices. Consequently, the popularity of portable electronic devices also provides a strong motivation to lower the power consumption of electronic devices.

Generally, if an electronic device operates at a lower voltage, the electronic device consumes less power. Hence, one conventional approach to reducing power consumption involves lowering a voltage that powers an electronic device. For example, over the last couple of decades voltages powering integrated circuits (ICs) of electronic devices have been lowered from approximately five volts (5V) to approximately one volt (1V) as process technologies for manufacturing the integrated circuits have advanced. Other conventional approaches have been developed that support switching between voltage levels at different times. These conventional approaches, however, may use an amount of power as a result of a switching function that is greater than an amount saved by switching voltages. Furthermore, switching between voltage levels may reduce a level of reliability at which load circuitry is capable of fulfilling assigned computing tasks.

SUMMARY

In an example aspect, an integrated circuit is disclosed. The integrated circuit includes a first power rail, a second power rail, and a load power rail. The integrated circuit further includes a first set of transistors including first transistors that are coupled to the first power rail, a second set of transistors including second transistors that are coupled to the second power rail, and power-multiplexer circuitry. The power-multiplexer circuitry is configured to switch access to power for the load power rail from the first power rail to the second power rail by sequentially turning off the first transistors of the first set of transistors and then sequentially turning on the second transistors of the second set of transistors.

In an example aspect, an integrated circuit is disclosed. The integrated circuit includes a first power rail, a second power rail, a load power rail, a first set of transistors, and a second set of transistors. The first set of transistors includes first transistors that are coupled to the first power rail, and the second set of transistors includes second transistors that are coupled to the second power rail. The integrated circuit further includes means for switching access to power for the load power rail from the first power rail to the second power rail. The means for switching access to power includes means for sequentially turning off the first transistors of the first set of transistors and means for sequentially turning on the second transistors of the second set of transistors after the first transistors of the first set of transistors are off.

In an example aspect, a method for power rail multiplexing in an integrated circuit is disclosed. The method includes supplying power to a circuit load at a first voltage using first transistors of a first set of transistors, with the first transistors coupled to a first power rail that corresponds to the first voltage. The method further includes sequentially turning off the first transistors of the first set of transistors. The method also includes, after sequentially turning off the first transistors, sequentially turning on second transistors of a second set of transistors, with the second transistors coupled to a second power rail that corresponds to a second voltage. The method further includes supplying power to the circuit load at the second voltage using the second transistors of the second set of transistors.

In an example aspect, an integrated circuit is disclosed. The integrated circuit includes a circuit load, a first power rail, a second power rail, and a load power rail that is coupled to the circuit load. The integrated circuit further includes multiple power-multiplexer tiles that are disposed in a chained arrangement. The power-multiplexer tiles are configured to propagate a selection signal between consecutive power-multiplexer tiles in a direction along the chained arrangement to disconnect the first power rail from the load power rail. The multiple power-multiplexer tiles are further configured to propagate a feedback signal between consecutive power-multiplexer tiles in a reverse direction along the chained arrangement to connect the second power rail to the load power rail.

DETAILED DESCRIPTION

Figure 1:
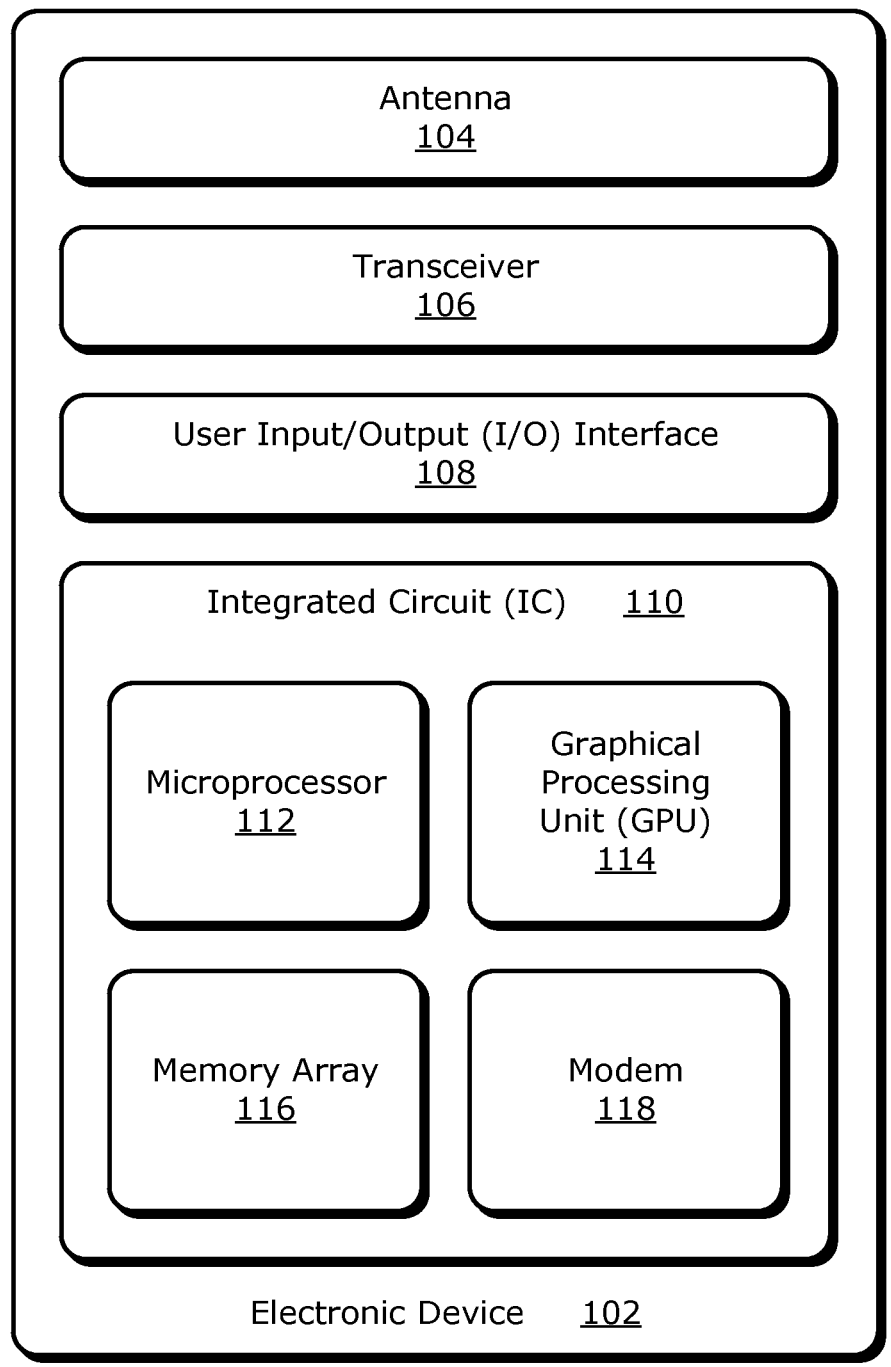
FIG. 1 depicts an example electronic device that includes an integrated circuit (IC).

Power management is an area of integrated circuit (IC) design or operation in which power multiplexing techniques may be utilized to provide power reduction opportunities. During times of nonuse, an integrated circuit may be powered down completely to reduce energy consumption. At times of lower utilization or to retain some stored data, an integrated circuit may be powered down to a lower voltage level to reduce power consumption. If an integrated circuit cannot be powered down as a whole, then one or more portions, or cores, may be powered down independently of one another. For example, in the context of a graphics processing unit (GPU), if the integrated circuit is waiting for additional data or user input before changing a display on a screen, the GPU core may be powered down completely. Alternatively, the voltage supply of the GPU core may be lowered. One way to lower the voltage supply is to switch the GPU core from one power rail to another power rail using power multiplexing techniques. In power multiplexing techniques, multiple power multiplexers are typically distributed at different physical locations in order to deliver power to certain integrated circuit areas. Distribution of the power multiplexers at different physical locations enables certain operational requirements of an integrated circuit to be met in terms of delivering power. One such operational requirement is the current-resistance (IR) drop requirement, as will be appreciated by the skilled artisan.

In operation, during power transition using power multiplexers, it is desirable to prevent a short-circuit current between the different power rails. A short-circuit current can exist if, for example, transistors of the power multiplexer that are coupled to different power rails of arbitrary voltages are turned on at the same time.

As an example, consider the following. If an integrated circuit has a core that is capable of being switched between two different power rails, the core may be connected to the two different power rails via two respective transistors, e.g., two field effect transistors (FETs). To connect the core to a particular power rail, the corresponding transistor is turned on. Likewise, if the core is not to be powered by the particular power rail, the corresponding transistor is turned off. When switching between the two different power rails, if both transistors are turned on at the same time while the two different power rails are held at different voltages, an undesirable short-circuit current path is created between the two different power rails, such as by way of a third rail that powers a load of the core.

In addition, the transistors corresponding to the different power rails cannot be turned off simultaneously for an extended period of time, as such a condition would create an undesirable voltage drop in the load caused by a discharge of the intrinsic capacitance of the load. The undesirable voltage drop can cause data stored in the core to be lost, as well as other problems that will be appreciated by the skilled artisan.

Particular implementations of the subject matter described in this document can be implemented to realize one or more of the following potential advantages. Through self-timed power multiplexer control techniques, transistors can be managed in association with power rail transition to prevent short-circuit current. For example, the self-timed power multiplexer control techniques and associated circuitry can ensure that a transistor associated with one power rail is turned on after a transistor associated with another power rail is turned off. Further, the power multiplexer control techniques can also ensure that transistors for different power rails are not turned off for an undesirable period of time. Thus, problems associated with the undesirable voltage drop described above are mitigated.

An example of a suitable integrated circuit to which the described implementations may apply includes a first power rail, a second power rail, and a load power rail. A first set of transistors including first transistors are coupled to the first power rail and a second set of transistors including second transistors are coupled to the second power rail. Power multiplexer circuitry is configured to switch access to power for the load power rail from the first power rail to the second power rail by sequentially turning off the first transistors of the first set of transistors and then sequentially turning on the second transistors of the second set of transistors. For example, the power multiplexer circuitry may be configured to disconnect the load power rail from the first power rail and to connect the load power rail to the second power rail by sequentially turning off the first transistors of the first set of transistors and then sequentially turning on the second transistors of the second set of transistors. In some implementations, the power multiplexer circuitry is further configured to sequentially turn off the first transistors of the first set of transistors in a first order and thereafter to sequentially turn on the second transistors of the second set of transistors in a second order, with the second order being a reverse of the first order. The power multiplexer circuitry may include self-timed circuitry.

In some implementations, operational timing of the self-timed circuitry is independent of a periodic clock signal. The self-timed circuitry may include multiple circuit devices that have a joint operational timing that is based on an intrinsic speed of individual ones of the multiple circuit devices. In some implementations, the first transistors of the first set of transistors comprise first transistors that are coupled between the first power rail and the load power rail. Further, the second transistors of the second set of transistors comprise second transistors that are coupled between the second power rail and the load power rail. In some implementations, the power multiplexer circuitry includes a configurable delay device that has an adjustable operational period.

In some implementations, the integrated circuit further includes multiple power multiplexer tiles configured in a chained arrangement. Each respective power multiplexer tile of the multiple power multiplexer tiles includes a first respective transistor of the first transistors of the first set of transistors, and a respective second transistor of the second transistors of the second set of transistors. At least a portion of the power multiplexer circuitry is distributed across the chained arrangement of the multiple power multiplexer tiles. In some implementations, the power multiplexer circuitry includes a set of delay circuits. A respective delay circuit of the set of delay circuits is coupled between a respective first transistor of the first set of transistors and a respective second transistor of the second set of transistors. The respective delay circuit is configured to prevent the respective second transistor from being turned on if the respective first transistor is on. In some implementations, the integrated circuit further includes a voltage detector that is configured to detect a higher voltage between a first voltage corresponding to the first power rail and a second voltage corresponding to the second power rail. The voltage detector is configured to power at least part of the power multiplexer circuitry using the higher voltage as detected.

In some implementations, the integrated circuit further includes a third power rail and a third set of transistors including third transistors that are coupled to the third power rail. The power multiplexer circuitry is further configured to switch access to power for the load power rail from the first power rail to the third power rail by sequentially turning off the first transistors and then sequentially turning on the third transistors. For example, the power multiplexer circuitry may be configured to disconnect the load power rail from the first power rail and to connect the load power rail to the third power rail by sequentially turning off the first transistors of the first set of transistors and then sequentially turning on the third transistors of the third set of transistors. The power multiplexer circuitry includes a power rail selection decoder that is configured to decode a power rail selection signal. The power rail selection signal is indicative of a power source for the load power rail.

In some implementations, the power multiplexer circuitry is further configured to switch access to power for the load power rail from the second power rail to the first power rail by sequentially turning off the second transistors of the second set of transistors and then sequentially turning on the first transistors of the first set of transistors. For example, the power multiplexer circuitry may be configured to disconnect the load power rail from the second power rail and to connect the load power rail to the first power rail by sequentially turning off the second transistors of the second set of transistors and then sequentially turning on the first transistors of the first set of transistors.

The power multiplexer control techniques can be applied in various scenarios including, by way of example and not limitation, 2-to-1 power multiplexers, 3-to-1 power multiplexes, and in general to n-to-1 power multiplexers. In addition, there is no restriction with respect to the voltage relationship between different power rails that utilize the power multiplexers.

FIG. 1 depicts an example electronic device 102 that includes an integrated circuit (IC) 110. As shown, the electronic device 102 includes an antenna 104, a transceiver 106, and a user input/output (I/O) interface 108 in addition to the IC 110. Illustrated examples of an IC 110 include a microprocessor 112, a graphics processing unit (GPU) 114, a memory array 116, and a modem 118.

The electronic device 102 may be a mobile or battery-powered device or a fixed device that is designed to be powered by an electrical grid during operation. Examples of an electronic device 102 include a server computer, a network switch or router, a blade of a data center, a personal computer, a desktop computer, a notebook computer, a tablet computer, a smart phone, an entertainment appliance, or a wearable computing device such as a smartwatch, intelligent glasses, or an article of clothing. An electronic device 102 may also be a device, or a portion thereof, having embedded electronics. Examples of an electronic device 102 with embedded electronics include a passenger vehicle, industrial equipment, a refrigerator or other home appliance, a drone or other unmanned aerial vehicle (UAV), or a power tool.

For an electronic device with a wireless capability, the electronic device 102 includes an antenna 104 that is coupled to a transceiver 106 to enable reception or transmission of one or more wireless signals. The IC 110 may be coupled to the transceiver 106 to enable the IC 110 to have access to received wireless signals or to provide wireless signals for transmission via the antenna 104. The electronic device 102 as shown also includes at least one user I/O interface 108. Examples of an I/O interface 108 include a keyboard, a mouse, a microphone, a touch-sensitive screen, a camera, an accelerometer, a haptic mechanism, a speaker, a display screen, and a projector.

The IC 110 may comprise, for example, one or more instances of a microprocessor 112, a GPU 114, a memory array 116, a modem 118, and so forth. The microprocessor 112 may function as a central processing unit (CPU) or other general-purpose processor. Some microprocessors include different parts, such as multiple processing cores, that may be individually powered on or off. The GPU 114 may be especially adapted to process visual-related data to be displayed for a person. If visual-related data is not being processed or rendered, the GPU 114 may be powered down. The memory array 116 stores data for the microprocessor 112 or the GPU 114. Example types of memory for the memory array 116 include random access memory (RAM), such as dynamic RAM (DRAM) or static RAM (SRAM), flash memory, and so forth. If programs are not accessing data stored in memory, the memory array 116 may be powered down. The modem 118 modulates a signal to encode information into the signal or demodulates a signal to extract encoded information. If there is no information to encode or decode for outbound or inbound communication, the modem 118 may be idled to reduce power consumption. The IC 110 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The IC 110 may also comprise a system on a chip (SOC). An SOC may integrate a sufficient number or type of components to enable the SOC to provide computational functionality as a notebook, a mobile phone, or another electronic apparatus using one chip. Components of an SOC, or an IC 110 generally, may be termed blocks or cores. Examples of cores or circuitry blocks include a voltage regulator, a memory array, a memory controller, a general-purpose processor, a cryptographic processor, a modem, a vector processor, an interface or communication controller, a wireless controller, and a GPU. Any of these cores or circuitry blocks, such as a processing or GPU core, may further include multiple internal cores. A core of an SOC may be powered down if not in use according to the techniques described in this document.

Figure 2:
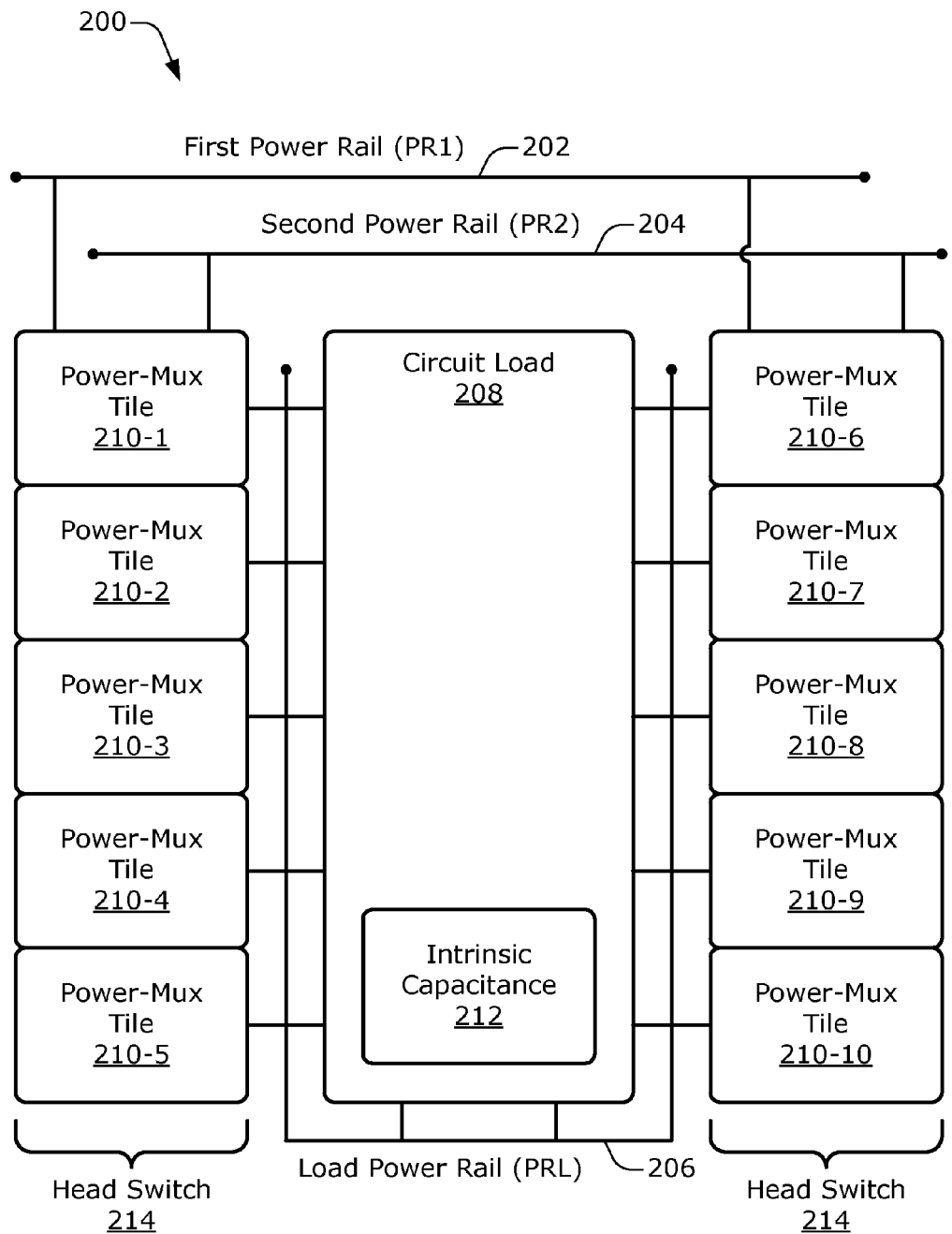
FIG. 2 depicts an example IC portion that includes multiple power-multiplexer (power-mux) tiles.

FIG. 2 depicts an example IC portion 200 that includes multiple power-multiplexer tiles, or power-mux tiles, 210-1 to 210-10. As illustrated, IC portion 200 includes three power rails: a first power rail 202 (PR1), a second power rail 204 (PR2), and a load power rail 206 (PRL). IC portion 200 also includes a circuit load 208, ten power-mux tiles 210-1 to 210-10, intrinsic capacitance 212, and a head switch 214. As used herein, the term "mux" refers to multiplexer. The circuit load 208 may correspond to a block or a core of the IC. The intrinsic capacitance 212 represents capacitive effects resulting from a mechanism or a material used to construct circuit devices of the circuit load 208. For example, metal lines and transistors may have or create an intrinsic capacitance.

In one or more embodiments, the first power rail 202 and the second power rail 204 are held at different voltages by a power management IC (PMIC), which is not shown. The PMIC may be internal to or external of the same IC as that of the IC portion 200. The PMIC is configured as a voltage source to supply voltages to power rails at specified voltage levels through voltage conversion or regulation. Generally, a head switch is connected between a power rail that is serving as a voltage source and a load performing digital processing. For the IC portion 200, the head switch 214 is connected between the first power rail 202 and the circuit load 208 and between the second power rail 204 and the circuit load 208. The head switch 214 may be implemented, for example, using p-channel or p-type metal-oxide-semiconductor (PMOS) devices that are formed with n-well or n-substrate technology, such as multiple p-type field effect transistors (PFETs). The head switch 214 may be realized as a globally distributed head switch (GDHS) or as a block head switch (BHS).

The head switch 214 includes multiple power-mux tiles 210-1 to 210-10. Specifically, power-mux tiles 210-1, 210-2, 210-3, 210-4, 210-5, 210-6, 210-7, 210-8, 210-9, and 210-10 are shown. However, the head switch 214 may include a different number of power-mux tiles 210. Multiple power-mux tiles 210-1 to 210-10 are disposed at least partially around the circuit load 208 in a particular arrangement as shown, but alternative arrangements may be implemented. Although different individual power-mux tiles 210 are shown adjacent to at least one other individual power-mux tile 210, power-mux tiles 210 may alternatively be disposed in a spaced-apart arrangement. Also, more or fewer than ten power-mux tiles 210 may be utilized.

The first power rail 202 and the second power rail 204 are both coupled to each power-mux tile 210. Each power-mux tile 210 is further coupled to the load power rail 206. The load power rail 206 is coupled to the circuit load 208. For the IC portion 200, the first power rail 202 and the second power rail 204 are configured to supply power to the load power rail 206 and thus to the circuit load 208 via the head switch 214 using the multiple power-mux tiles 210-1 to 210-10. In operation, each power-mux tile 210 is configured to switch from using the first power rail 202 to using the second power rail 204 to supply power to the circuit load 208 via the load power rail 206. An arrangement of multiple power-mux tiles along with power-mux circuitry is shown in FIG. 3.

Figure 3:
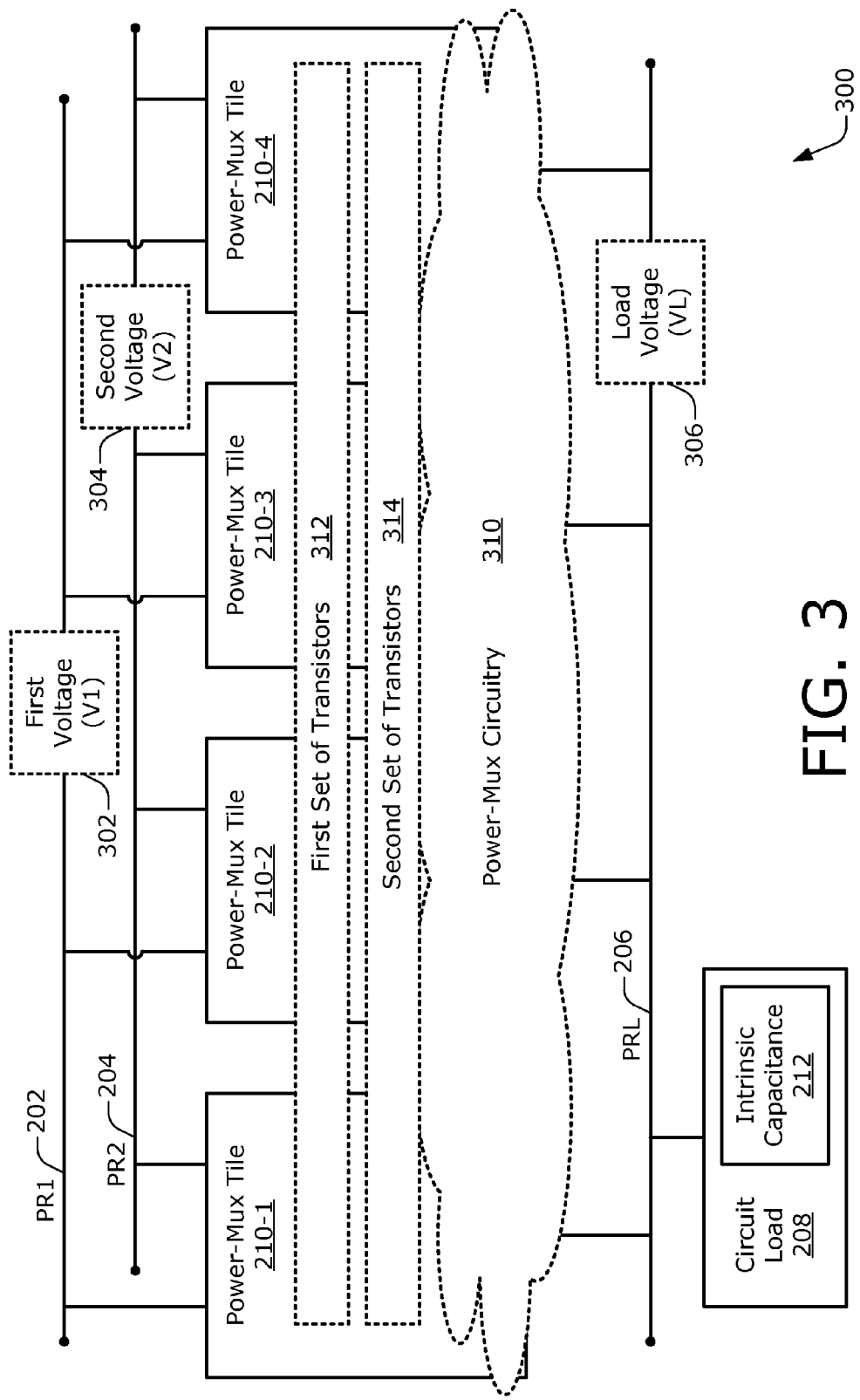
FIG. 3 depicts an example chained arrangement of multiple power-mux tiles in conjunction with power-mux circuitry.

FIG. 3 depicts an example chained arrangement 300 of multiple power-mux tiles 210-1 to 210-4 in conjunction with power-mux circuitry 310. FIG. 3 includes the first power rail 202, the second power rail 204, four power-mux tiles 210-1 to 210-4, the load power rail 206, the circuit load 208, and the intrinsic capacitance 212. FIG. 3 further includes a first voltage 302 (V1), a second voltage 304 (V2), a load voltage 306 (VL), power-mux circuitry 310, a first set of transistors 312, and a second set of transistors 314. First transistors of the first set of transistors 312 and second transistors of the second set of transistors 314 are shown explicitly in FIG. 4. The first power rail 202 corresponds to the first voltage 302 if, for example, the first power rail 202 is held at the first voltage 302. The second power rail 204 corresponds to the second voltage 304 if, for example, the second power rail 204 is held at the second voltage 304. The load power rail 206 corresponds to the load voltage 306. Although four power-mux tiles 210-1 to 210-4 are explicitly shown, more or fewer than four may be utilized in conjunction with power-mux circuitry 310.

In one or more embodiments, each of the power-mux tiles 210-1, 210-2, 210-3, and 210-4 is coupled to both the first power rail 202 and the second power rail 204. Each of the power-mux tiles 210-1, 210-2, 210-3, and 210-4 is also coupled to the load power rail 206. The load power rail 206 is coupled to the circuit load 208, which includes the intrinsic capacitance 212. The first set of transistors 312 is distributed across the multiple power-mux tiles 210-1 to 210-4. For example, a first transistor of the first set of transistors 312 may be included in each power-mux tile 210. The second set of transistors 314 is distributed across the multiple power-mux tiles 210-1 to 210-4. For example, a second transistor of the second set of transistors 314 may be included in each power-mux tile 210.

The power-mux circuitry 310 is distributed across the multiple power-mux tiles 210-1 to 210-4. A portion of the power-mux circuitry 310 may be disposed internal to each power-mux tile 210. A portion of the power-mux circuitry 310 may be disposed external to the multiple power-mux tiles 210-1 to 210-4, such as between or among the multiple power-mux tiles 210-1 to 210-4 to propagate one or more control signals. In an example operation, power-mux circuitry 310 provides a means for switching access to power for the load power rail 206 from the first power rail 202 to the second power rail 204 by sequentially turning off first transistors of the first set of transistors 312 and then sequentially turning on second transistors of the second set of transistors 314. By turning off the first transistors of the first set of transistors 312 before turning on the second transistors of the second set of transistors 314, a first transistor and a second transistor are not simultaneously turned on, so a short-circuit current condition may be avoided. In this example manner, the power-mux circuitry 310 provides a means for preventing a short-circuit current between the first power rail 202 and the second power rail 204. By sequentially turning on the second transistors of the second set of transistors 314, power is applied to the circuit load in stages such that a size of an undesirable voltage droop along the load power rail 206 may be at least reduced.

Figure 4:
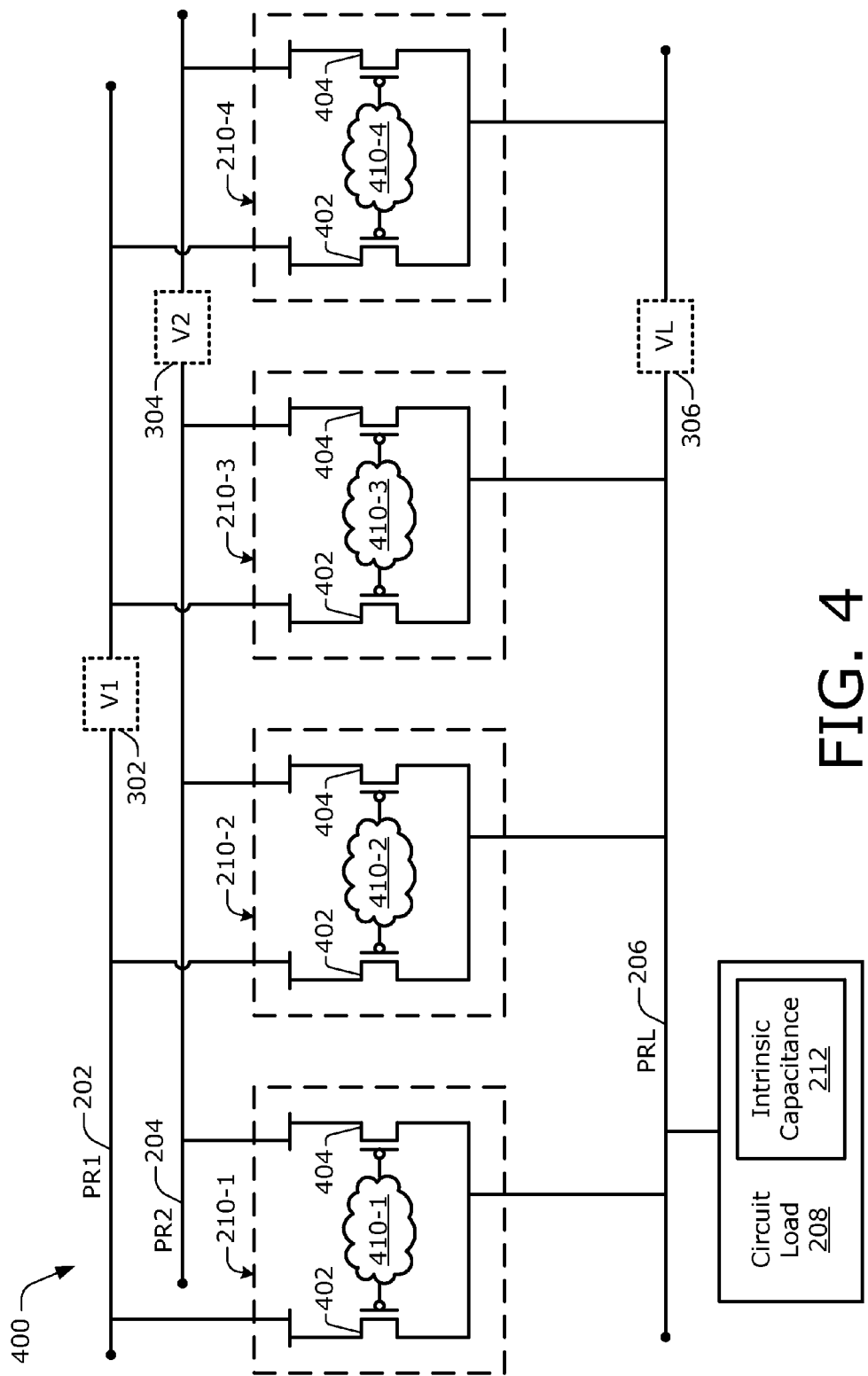
FIG. 4 depicts another example chained arrangement of multiple power-mux tiles that include transistors and delay circuitry.

FIG. 4 depicts an example chained arrangement 400 of multiple power-mux tiles 210-1 to 210-4 that include transistors and delay circuits 410-1 to 410-4. FIG. 4 includes the first power rail 202, the second power rail 204, the load power rail 206, the circuit load 208, and four power-mux tiles 210-1 to 210-4. Also depicted is the intrinsic capacitance 212 of the circuit load 208, the first voltage 302 that corresponds to the first power rail 202, the second voltage 304 that corresponds to the second power rail 204, and the load voltage 306 that corresponds to the load power rail 206. The chained arrangement 400 includes four (4) first transistors 402, four (4) second transistors 404, and a set of delay circuits 410-1 to 410-4.

As illustrated, each respective power-mux tile 210 includes a first transistor 402, a second transistor 404, and a delay circuitry 410. Specifically, the power-mux tile 210-1 includes a first transistor 402, a second transistor 404, and a delay circuit 410-1. The power-mux tile 210-2 includes a first transistor 402, a second transistor 404, and a delay circuit 410-2. The power-mux tile 210-3 includes a first transistor 402, a second transistor 404, and a delay circuit 410-3. The power-mux tile 210-4 includes a first transistor 402, a second transistor 404, and a delay circuit 410-4. The first set of transistors 312 of FIG. 3 may include the first transistors 402, and the second set of transistors 314 of FIG.

3 may include the second transistors 404. The power-mux circuitry 310 of FIG. 3 may include the four delay circuits 410-1 to 410-4.

Multiple power-mux tiles 210-1 to 210-4 are configured in a chained arrangement. Aspects of a chained arrangement are described further with particular reference to FIG. 15. Each respective power-mux tile 210 includes a respective first transistor 402 and a respective second transistor 404. At least part of the power-mux circuitry 310 of FIG. 3 is distributed across the chained arrangement of the multiple power-mux tiles 210-1 to 210-4 as the delay circuit 410-1, the delay circuit 410-2, the delay circuit 410-3, and the delay circuit 410-4. The first transistors 402 are associated with the first power rail 202, and the second transistors 404 are associated with the second power rail 204.

In one or more embodiments, each first transistor 402 and each second transistor 404 comprises a PFET transistor, which may comprise a transistor that is configured to turn power on or turn power off for the load power rail 206 or the circuit load 208 thereof. Sizes of the first transistors 402 or the second transistors 404 may be scaled in accordance with a specified current or power level. The first transistors 402 of the first set of transistors 312 comprise first transistors that are coupled between the first power rail 202 and the load power rail 206. The second transistors 404 of the second set of transistors 314 comprise second transistors that are coupled between the second power rail 204 and the load power rail 206. More specifically, each first transistor 402 may be coupled to the first power rail 202 and to the load power rail 206 at the source and drain terminals of the transistor. Each second transistor 404 may be coupled to the second power rail 204 and to the load power rail 206 at the source and drain terminals of the transistor.

For each power-mux tile 210, a part of the power-mux circuitry 310 of FIG. 3 may be coupled between a gate terminal of the first transistor 402 and a gate terminal of the second transistor 404. A respective delay circuit 410 of the set of delay circuits 410-1 to 410-4 is coupled between a respective first transistor 402 of the first set of transistors 312 of FIG. 3 and a respective second transistor 404 of the second set of transistors 314. Specifically, the delay circuit 410-1 is coupled between the gate terminals of the first transistor 402 and the second transistor 404 of the power-mux tile 210-1. The delay circuit 410-2 is coupled between the gate terminals of the first transistor 402 and the second transistor 404 of the power-mux tile 210-2. The delay circuit 410-3 is coupled between the gate terminals of the first transistor 402 and the second transistor 404 of the power-mux tile 210-3. The delay circuit 410-4 is coupled between the gate terminals of the first transistor 402 and the second transistor 404 of the power-mux tile 210-4.

In an example operation, the power-mux circuitry 310 of FIG. 3 is configured to switch access to power for the load power rail 206 from the first power rail 202 to the second power rail 204 by sequentially turning off the first transistors 402 of the first set of transistors 312 and then sequentially turning on the second transistors 404 of the second set of transistors 314. For example, the power multiplexer circuitry 310 may be configured to disconnect the load power rail 206 from the first power rail 202 and to connect the load power rail 206 to the second power rail 204 by sequentially turning off the first transistors 402 of the first set of transistors 312 and then sequentially turning on the second transistors 404 of the second set of transistors 314. The power-mux circuitry 310 may include a delay circuit 410-1, a delay circuit 410-2, a delay circuit 410-3, and a delay circuit 410-4. The power-mux circuitry 310 may further be configured to sequentially turn off the first transistors 402 of the first set of transistors 312 in a first order. Thereafter, the power-mux circuitry 310 may sequentially turn on the second transistors 404 of the second set of transistors 314 in a second order, with the second order being a reverse of the first order. An example of a sequential approach to turning on first transistors 402 and then turning off second transistors 404 of multiple power-mux tiles 210-1 to 210-4 is described herein with reference to FIGS. 5-9.

In an example implementation, the power-mux circuitry 310 may switch the circuit load 208 back to the first power rail 202 from the second power rail 204. For instance, the power-mux circuitry 310 may be configured to switch access to power for the load power rail 206 from the second power rail 204 to the first power rail 202 by sequentially turning off the second transistors 404 of the second set of transistors 314 and then sequentially turning on the first transistors 402 of the first set of transistors 312. More specifically, the power multiplexer circuitry 310 may be configured to disconnect the load power rail 206 from the second power rail 204 and to connect the load power rail 206 to the first power rail 202 by sequentially turning off the second transistors 404 of the second set of transistors 314 and then sequentially turning on the first transistors 402 of the first set of transistors 312.

Although the first transistor 402 and the second transistor 404 are shown and described herein as p-type FET (PFET) transistors, other transistor types may alternatively be implemented. For example, an n-type FET (NFET) may be used. An NFET transistor is utilized if a foot switch mechanism is employed to provide power to a load on an IC chip instead of a head switch mechanism as shown in FIG. 4. A PFET may be implemented using a p-channel device that is formed with n-well or n-substrate technology. An NFET, on the other hand, may be implemented using an n-channel device that is formed with p-well or p-substrate technology. Alternatively, a bipolar junction transistor (BJT) may be used.

As shown in FIG. 4, the delay circuits 410-1, 410-2, 410-3, and 410-4 are represented as part of respective ones of power-mux tiles 210-1, 210-2, 210-3, and 210-4. However, at least part of power-mux circuitry 310 of FIG. 3 may also be located apart from a power-mux tile 210. An example of parts of power-mux circuitry 310 that is external to power-mux tiles is described herein with particular reference to FIG. 15, and associated external power-mux control signaling is described herein with particular reference to FIGS. 6-8.

FIGS. 5-9 jointly illustrate a number of different states of the multiple power-mux tiles 210-1 to 210-4. These states correspond to different times as the power-mux circuitry 310 switches from supplying power to the load power rail 206 with the first power rail 202 using multiple first transistors 402 to supplying power to the load power rail 206 with the second power rail 204 using multiple second transistors 404. The illustrated power rails, circuit devices, and interconnections of FIGS. 5-9 are similar to those of FIG. 4 as described above.

Individual transistor operational states are indicated graphically using a "check mark" icon or an "X mark" icon. A legend 502 shows that a "check mark" indicates that a transistor is "ON" and an "X mark" indicates that a transistor is "OFF." An FET transistor that is turned on is biased at a gate terminal of the transistor such that current may flow through the transistor between a source and a drain. A transistor that is on acts like a closed switch. An FET transistor that is turned off is biased at a gate terminal of the transistor such that current is blocked from flowing between a source and a drain. A transistor that is off acts like a switch that is open. As is known in the art, real-world transistors, as opposed to ideal transistors that are used to model the behavior of real-world ones, may not be turned completely on or completely off. Transistors that are on have some non-zero resistance to current flow, and transistors that are off permit some level of current to flow. Hence, the phrase "turned on" is used herein with the understanding that a transistor that is turned on actually has some resistance, and the phrase "turned off" is used herein with the understanding that a transistor that is turned off permits some current flow, as is known by a skilled artisan.

Figure 5:
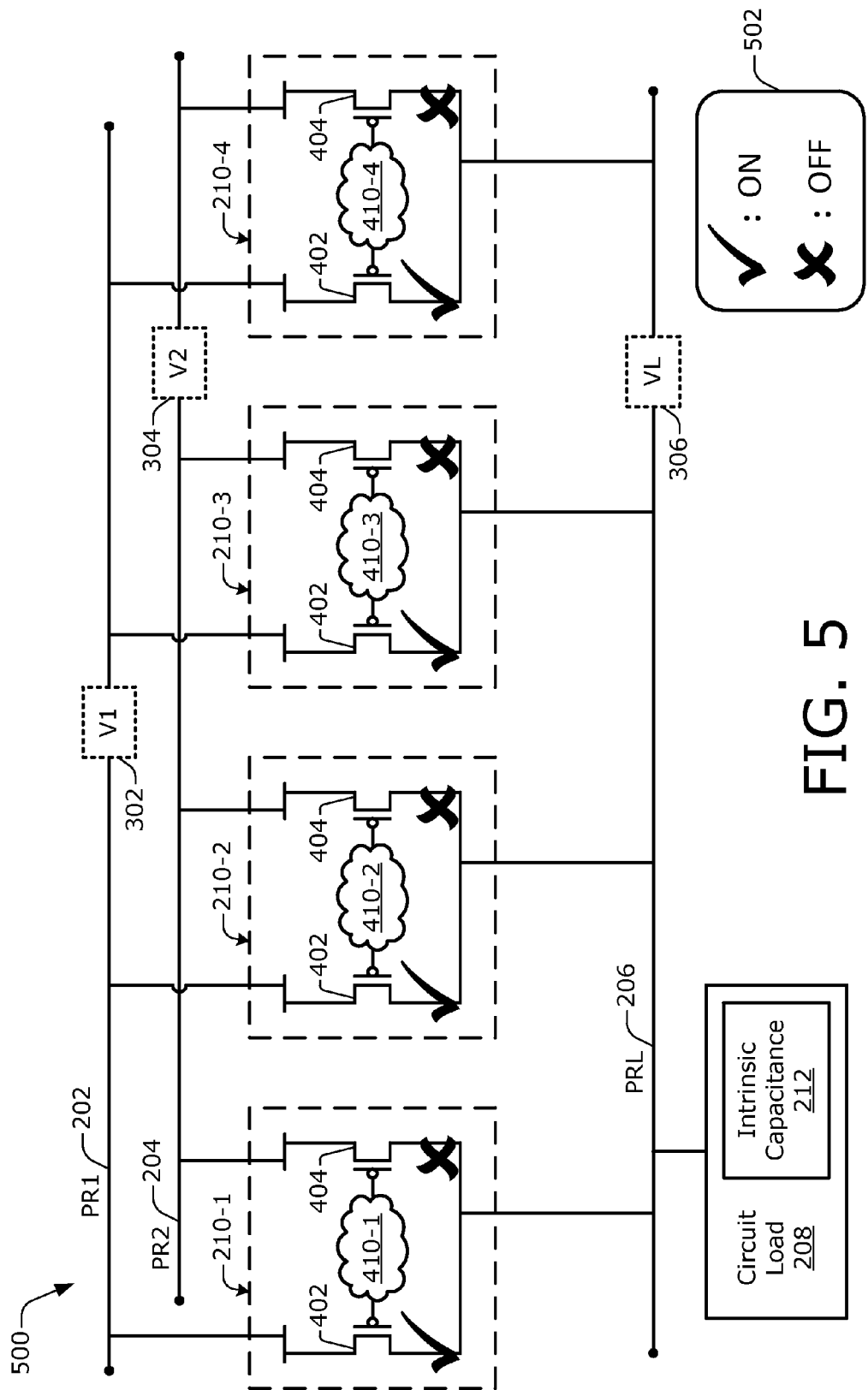
FIG. 5 illustrates an example first operational steady-state condition of multiple power-mux tiles.

FIG. 5 illustrates an example first operational steady-state condition 500 of the multiple power-mux tiles 210-1 to 210-4. The first operational steady-state condition 500 represents a situation in which the load power rail 206 is being powered by the first power rail 202. The first transistors 402 of the multiple power-mux tiles 210-1 to 210-4 are in an ON operational state as indicated by the "check marks" beneath the first transistors 402. Hence, current is permitted to flow from the first power rail 202 through the first transistors 402 to the load power rail 206. The load voltage 306, which corresponds to the load power rail 206, is established to equal the first voltage 302, which corresponds to the first power rail 202. The second transistors 404 of the multiple power-mux tiles 210-1 to 210-4 are in an OFF operational state as indicated by the "X marks" below the second transistors 404.

Figure 6:
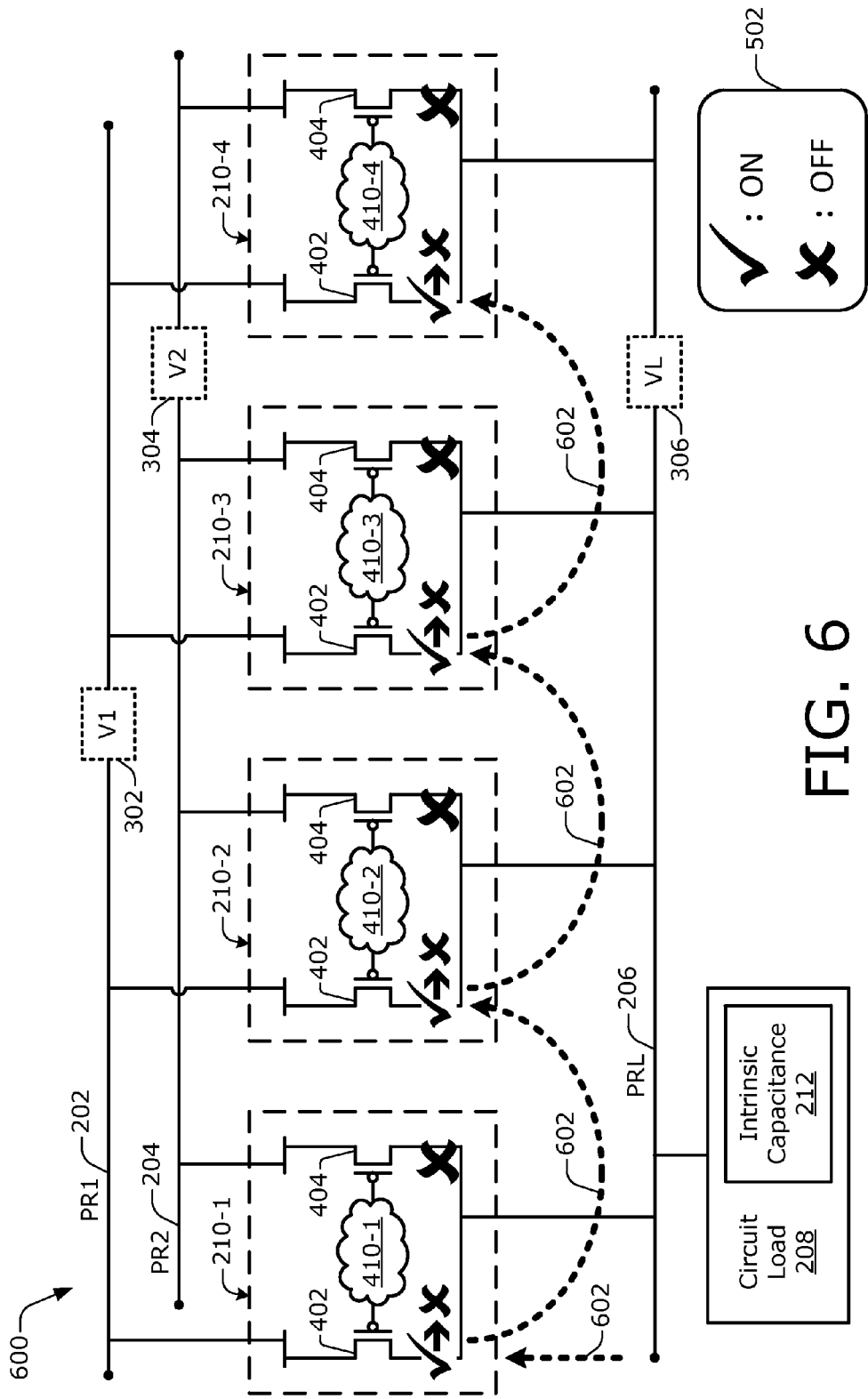
FIG. 6 illustrates an example transitional state of multiple power-mux tiles.

FIG. 6 illustrates an example transitional state 600 of the multiple power-mux tiles 210-1 to 210-4. In the example transitional state 600, the first transistors 402 are being turned off sequentially across the multiple power-mux tiles 210-1 to 210-4. More specifically, the first transistor 402 of the power-mux tile 210-1 is turned off first. Next, the first transistor 402 of the power-mux tile 210-2 is turned off, and then the first transistor 402 of the power-mux tile 210-3 is turned off. Lastly, the first transistor 402 of the power-mux tile 210-4 is turned off.

In one or more embodiments, a power rail selection signal 602 selects between or among two or more different power rails. In FIG. 6, the power rail selection signal 602, which may comprise one or more bits, selects between the first power rail 202 and the second power rail 204. The power-mux tile 210-1 receives the power rail selection signal 602 to initiate a power multiplexing process. The power rail selection signal 602 propagates to additional power-mux tiles sequentially. More specifically, the power rail selection signal 602 propagates to power-mux tile 210-2, then to power-mux tile 210-3, and finally to power-mux tile 210-4. The power-mux circuitry 310 of FIG. 3 provides a means for sequentially turning off the first transistors of the first set of transistors 312 by propagating the power rail selection signal 602 between two or more delay circuits. An example propagation mechanism for the power rail selection signal 602 is described herein with particular reference to FIG. 15.

Figure 7:
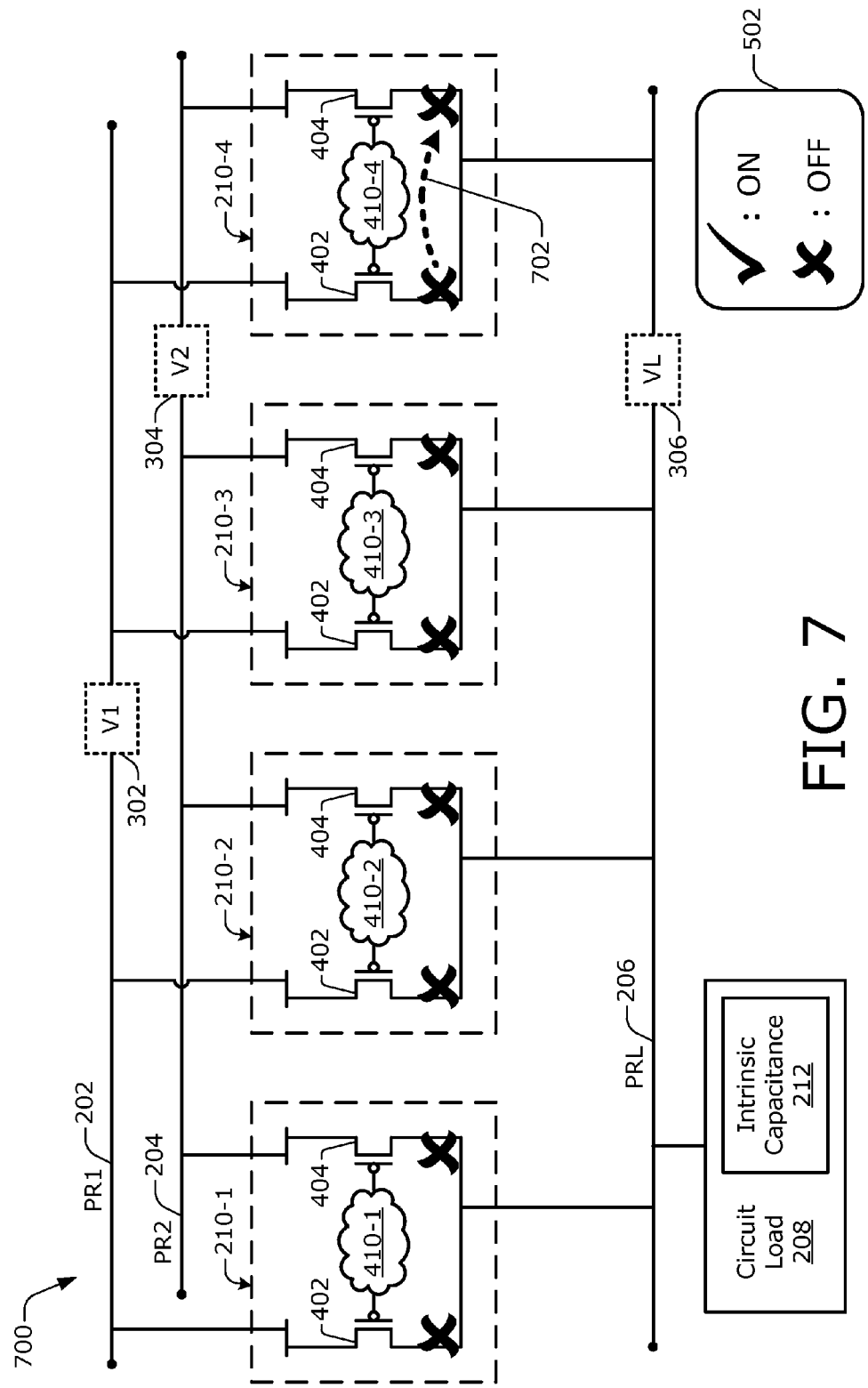
FIG. 7 illustrates another example transitional state of multiple power-mux tiles.

FIG. 7 illustrates an example transitional state 700 of the multiple power-mux tiles 210-1 to 210-4. In the example transitional state 700, the first transistors 402 of the multiple power-mux tiles 210-1 to 210-4 are in an OFF operational state as indicated by the "X marks" beneath each first transistor 402. Hence, current is blocked from flowing from the first power rail 202 through the first transistors 402 to the load power rail 206. The second transistors 404 of the multiple power-mux tiles 210-1 to 210-4 are also in an OFF operational state as indicated by the "X marks" below each second transistor 404. Hence, current is blocked from flowing from the second power rail 204 through the second transistors 404 to the load power rail 206. The load voltage 306 of the load power rail 206 is in an indeterminate state, but the load voltage 306 is decreasing and vectoring toward a ground level. During the transitional state 700, processing or memory retention viability of the circuit load 208 may be maintained by the intrinsic capacitance 212 for a finite time period.

In the example transitional state 700, a delay signal 702 propagates through the delay circuit 410-4 of the power-mux tile 210-4. The delay signal 702 takes a certain amount of time, such as 40-60 picoseconds, to propagate through the delay circuit 410-4 so that there is a delay between when the first transistor 402 of the power-mux tile 210-4 is turned off and when the second transistor 404 of the power-mux tile 210-4 is turned on. In effect, the delay circuit 410-4 may be configured to prevent the second transistor 404 from being turned on if the first transistor 402 is on. An example of a delay circuit 410 is described herein with particular reference to FIGS. 10-14.

Figure 8:
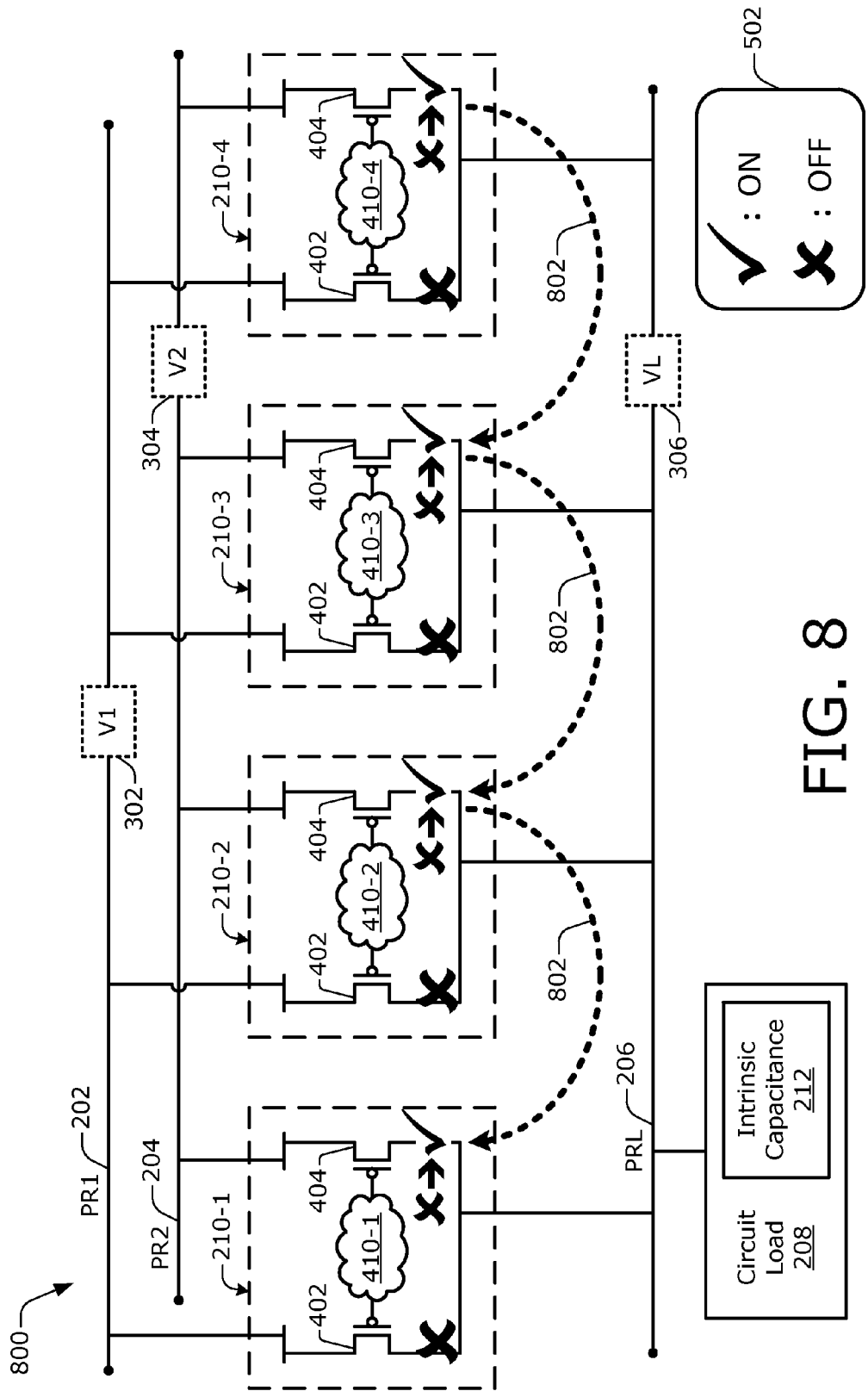
FIG. 8 illustrates yet another example transitional state of multiple power-mux tiles.

FIG. 8 illustrates an example transitional state 800 of the multiple power-mux tiles 210-1 to 210-4. In the example transitional state 800, the second transistors 404 are being turned on sequentially across the multiple power-mux tiles 210-1 to 210-4, but the turning on order of the second transistors 404 is reversed as compared to the turning off order of the first transistors 402 across the multiple power-mux tiles 210-1 to 210-4 as shown in FIG. 6. More specifically, the second transistor 404 of the power-mux tile 210-4 is turned on first. Next, the second transistor 404 of the power-mux tile 210-3 is turned on, and then the second transistor 404 of the power-mux tile 210-2 is turned on. Lastly, the second transistor 404 of the power-mux tile 210-1 is turned on. The second transistors 404 of the multiple power-mux tiles 210-1 to 210-4 may be turned on in stages to manage the in-rush of current to the circuit load 208 and to prevent, or to at least reduce, a voltage droop of the second voltage 304 that corresponds to the second power rail 204.

In one or more embodiments, a transistor operational state feedback signal 802 enables or causes a transistor of a consecutive power-mux tile 210 to be turned on. In FIG. 8, the transistor operational state feedback signal 802, which may comprise one or more bits, is forwarded to another power-mux tile 210 after a second transistor 404 of a consecutive power-mux tile 210 is turned on. After the delay signal 702 propagates through the delay circuit 410-4 of the power-mux tile 210-4 as shown in FIG. 7, the second transistor 404 of the power-mux tile 210-4 is turned on as shown in FIG. 8. In response to the second transistor 404 of the power-mux tile 210-4 being turned on, the transistor operational state feedback signal 802 is provided to the power-mux tile 210-3 to continue the power multiplexing process.

In response to receiving the transistor operational state feedback signal 802, the delay circuit 410-3 turns on the second transistor 404 of the power-mux tile 210-3. The transistor operational state feedback signal 802 is propagated to additional consecutive power-mux tiles sequentially to enable turning on additional ones of the second transistors 404. More specifically, the transistor operational state feedback signal 802 may be propagated to power-mux tile 210-2, and then to power-mux tile 210-1. The power-mux circuitry 310 of FIG. 3 provides a means for sequentially turning on the second transistors of the second set of transistors 314 after the first transistors of the first set of transistors 312 are off by propagating the transistor operational state feedback signal 802 between two or more delay circuits. An example propagation mechanism for the transistor operational state feedback signal 802 is described herein with particular reference to FIG. 15.

Figure 9:
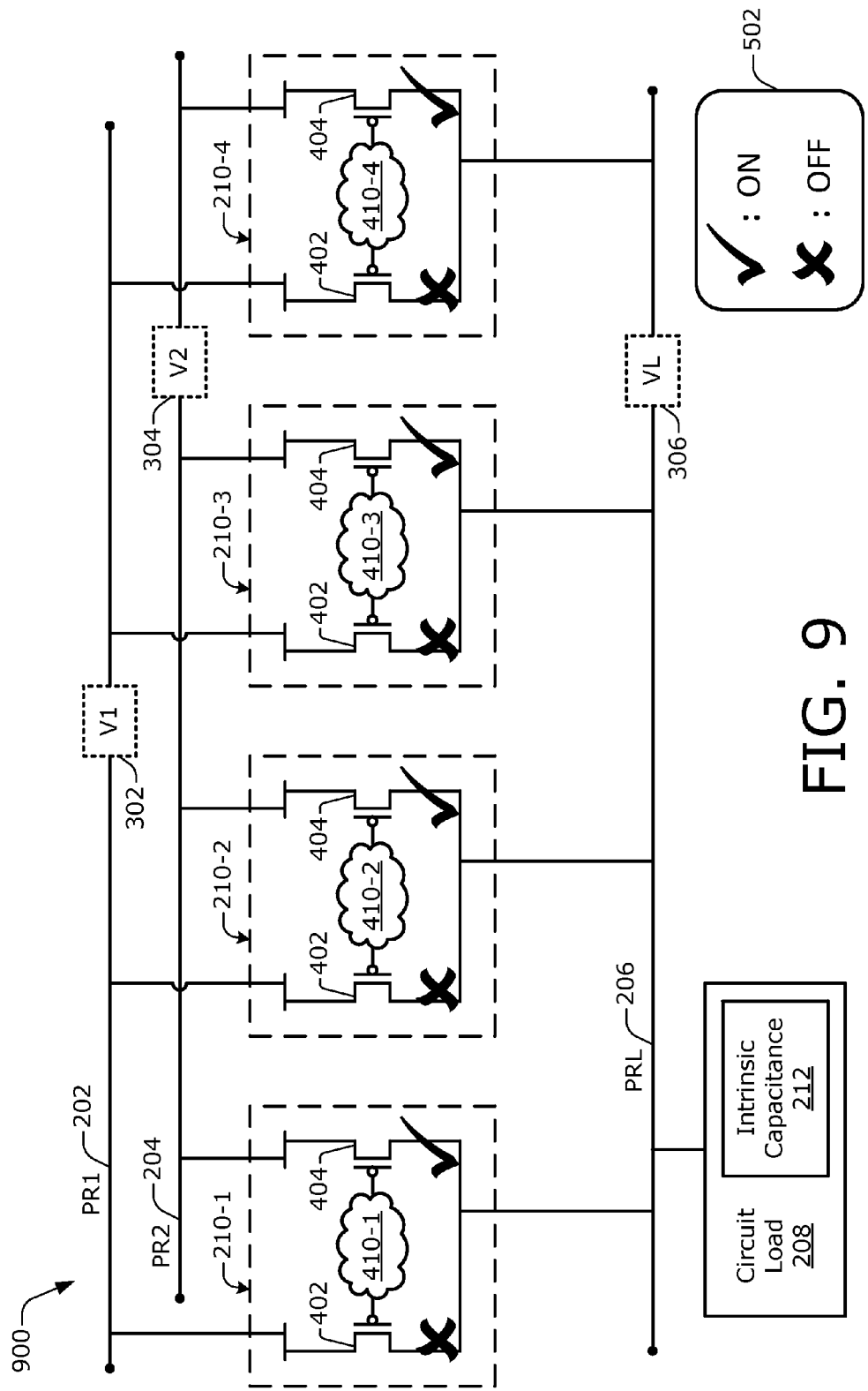
FIG. 9 illustrates an example second operational steady-state condition of multiple power-mux tiles.

FIG. 9 illustrates an example second operational steady-state condition 900 of the multiple power-mux tiles 210-1 to 210-4. The second operational steady-state condition 900 represents a situation in which the load power rail 206 is being powered by the second power rail 204. The second transistors 404 of the multiple power-mux tiles 210-1 to 210-4 are in an ON operational state as indicated by the "check marks" below the second transistors 404. Hence, current is permitted to flow from the second power rail 204 through the second transistors 404 to the load power rail 206. The load voltage 306, which corresponds to the load power rail 206, is established to equal the second voltage 304, which corresponds to the second power rail 204. The first transistors 402 of the multiple power-mux tiles 210-1 to 210-4 are in an OFF operational state as indicated by the "X marks" beneath the first transistors 402.

In an example implementation, an IC includes the circuit load 208, the first power rail 202, the second power rail 204, and the load power rail 206, which is coupled to the circuit load 208. The IC further includes multiple power-mux tiles 210-1 to 210-4 disposed in the chained arrangement 400. The multiple power-mux tiles 210-1 to 210-4 are configured to propagate a selection signal, such as the power rail selection signal 602, between consecutive power-mux tiles, such as between the power-mux tile 210-2 and the power-mux tile 210-3, in a direction along the chained arrangement 400 to disconnect the first power rail 202 from the load power rail 206. The multiple power-mux tiles 210-1 to 210-4 are further configured to propagate a feedback signal, such as the transistor operational state feedback signal 802, between consecutive power-mux tiles, such as the power-mux tile 210-4 and the power-mux tile 210-3, in a reverse direction along the chained arrangement 400 to connect the second power rail 204 to the load power rail 206.

In the example implementation, the multiple power-mux tiles 210-1 to 210-4 may include multiple first transistors 402 that are coupled between the first power rail 202 and the load power rail 206 and multiple second transistors 404 that are coupled between the second power rail 204 and the load power rail 206. The multiple power-mux tiles 210-1 to 210-4 may be further configured to electrically disconnect the first power rail 202 from the load power rail 206 by turning off the multiple first transistors 402 and to electrically connect the second power rail 204 to the load power rail 206 by turning on the multiple second transistors 404.

In the example implementation, a first transistor 402 corresponds to a second transistor 404 if both are disposed within a given power-mux tile 210 or if both are coupled to a same delay circuit 410. The multiple power-mux tiles 210-1 to 210-4 may further include a first transistor of the multiple first transistors 402 and a corresponding second transistor of the multiple second transistors 404 that is disposed within a same power-mux tile as the first transistor. The multiple power-mux tiles 210-1 to 210-4 may further include a consecutive second transistor of the multiple second transistors 404 that is disposed in another power-mux tile that is operationally consecutive to the same power-mux tile. The multiple power-mux tiles 210-1 to 210-4 may be further configured to turn on the corresponding second transistor based on the first transistor having an OFF operational state and responsive to a feedback signal, such as the transistor operational state feedback signal 802, being indicative of an ON operational state of the consecutive second transistor. By way of example only, the first transistor of the multiple first transistors 402 and the corresponding second transistor of the multiple second transistors 404 may be disposed within a same power-mux tile 210-2. Further, the consecutive second transistor of the multiple second transistors 404 may be disposed in another power-mux tile 210-3 that is operationally consecutive to the same power-mux tile 210-2.

Figure 10:
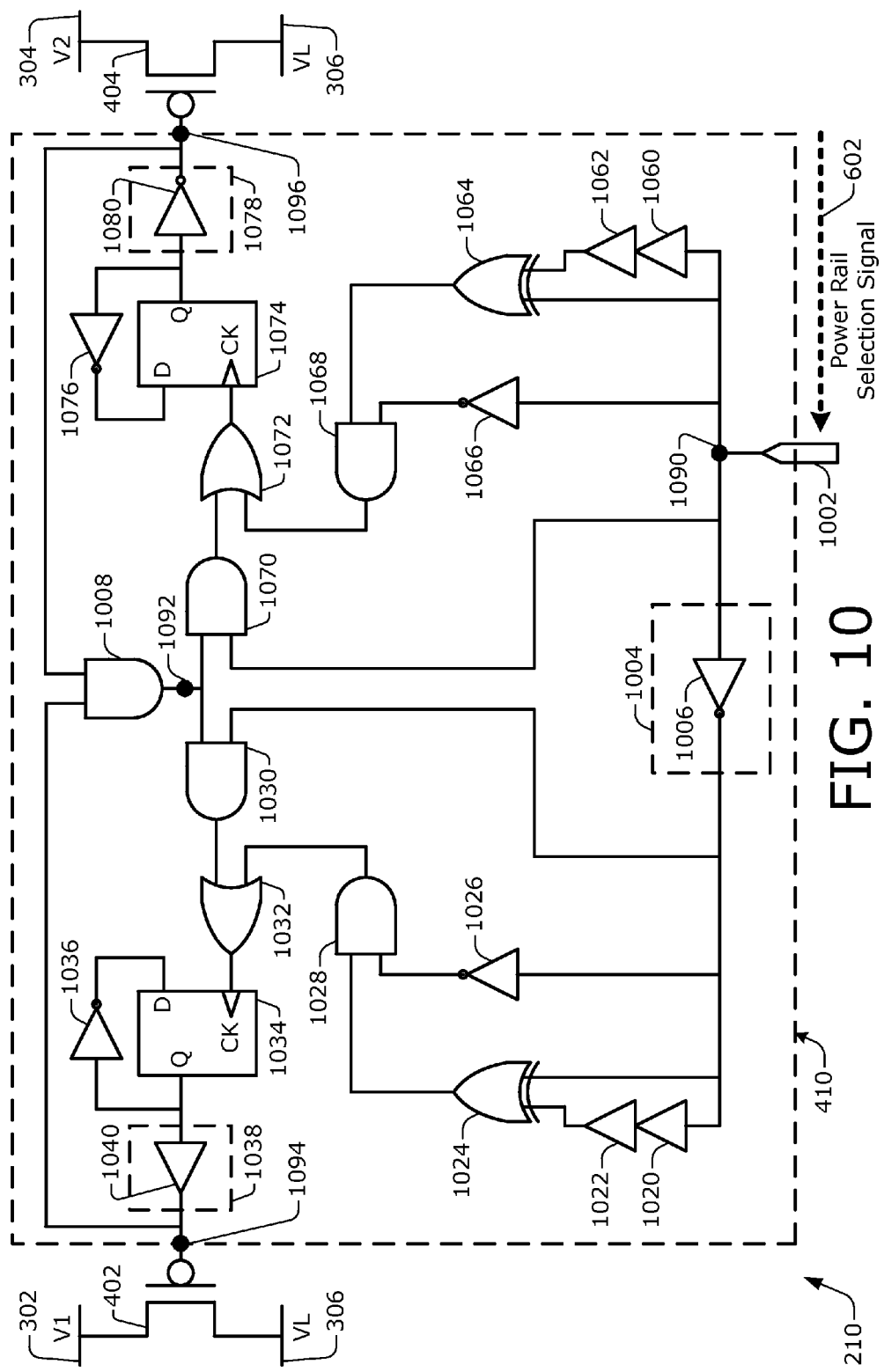
FIG. 10 depicts an example power-mux tile that includes two transistors, which are respectively associated with two power rails, and a delay circuit.
Figure 11:
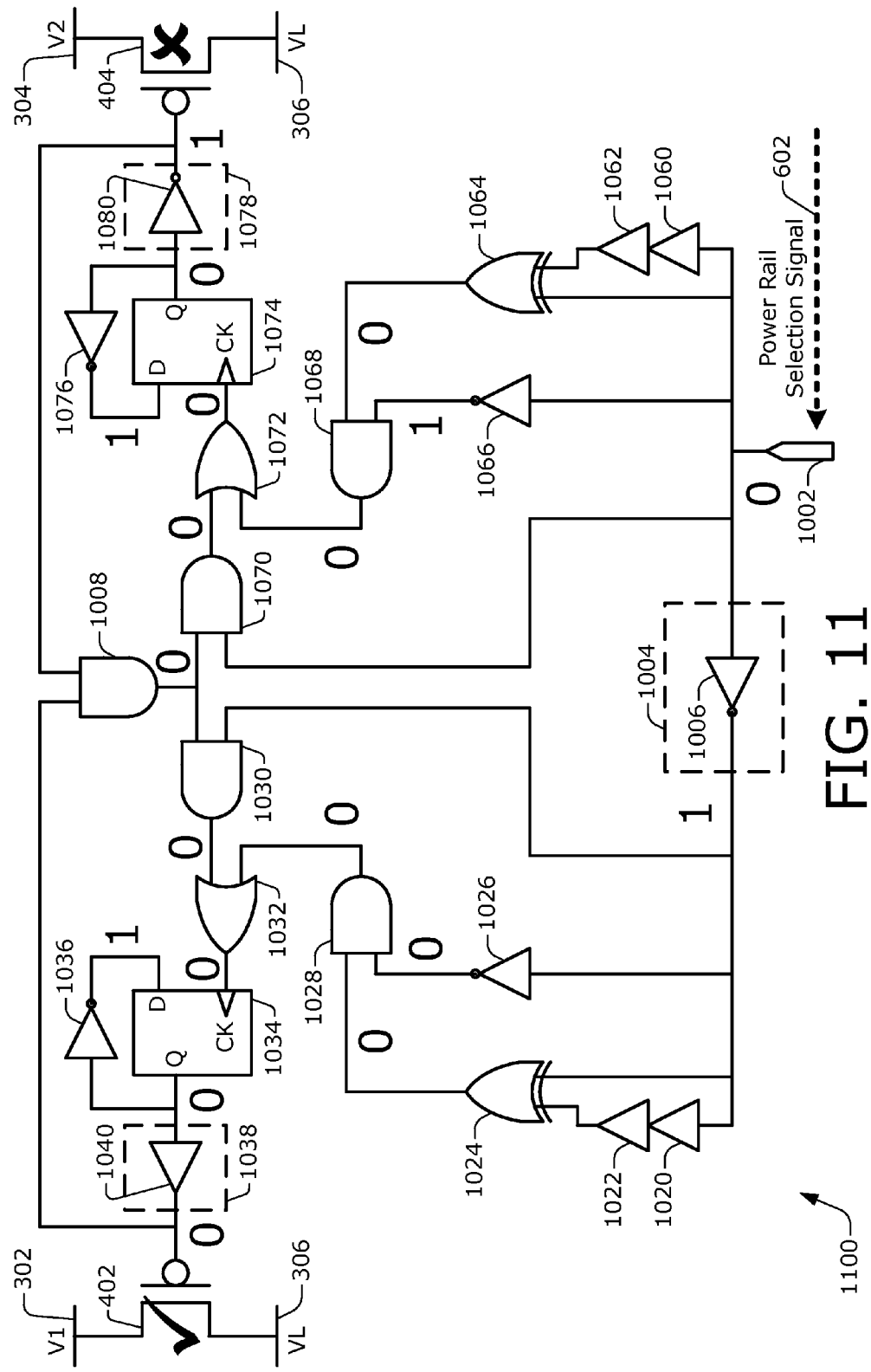
FIG. 11 illustrates an example first operational steady-state condition of the power-mux tile of FIG. 10.
Figure 12:
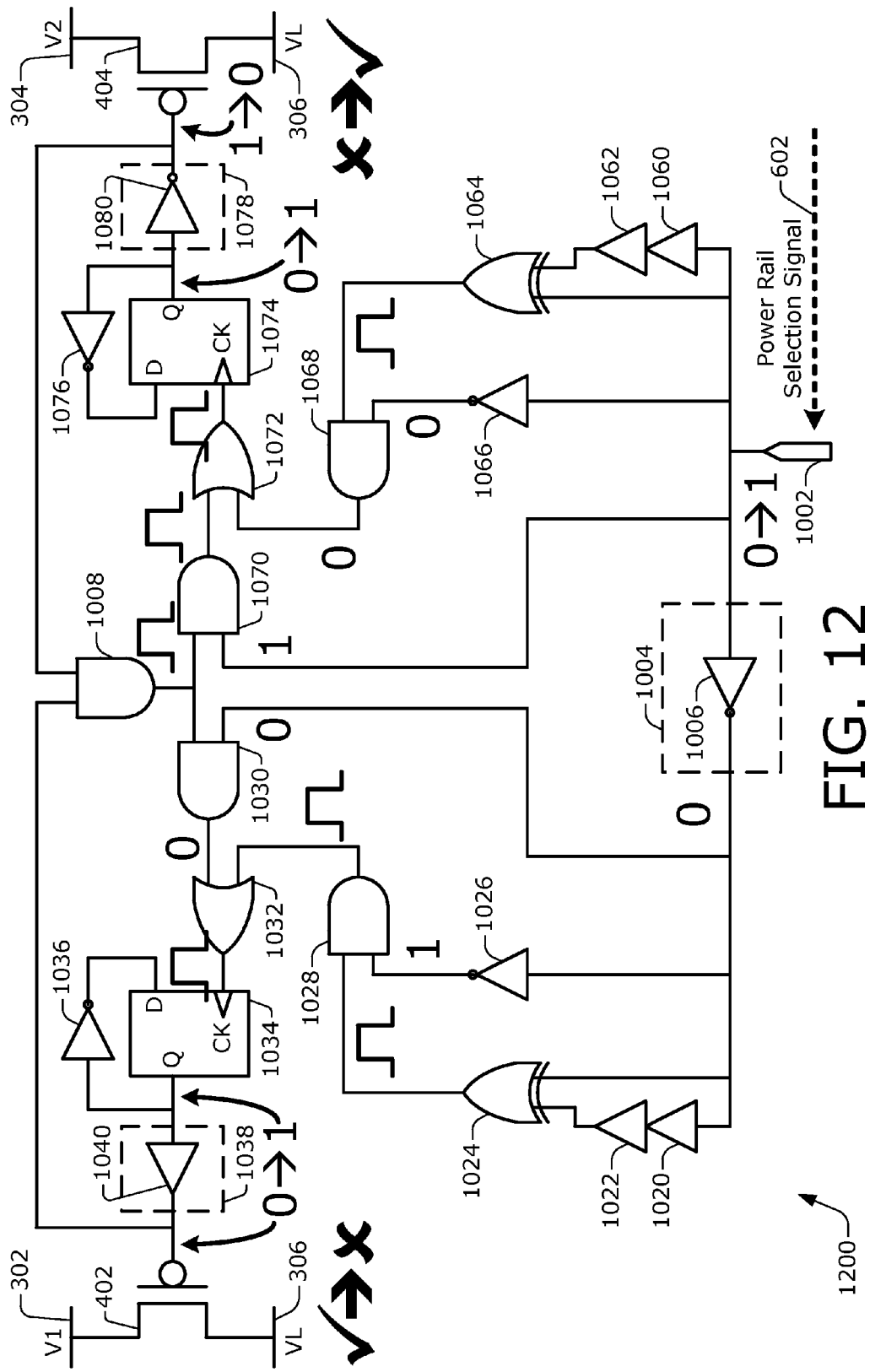
FIG. 12 illustrates an example transitional state of the power-mux tile of FIG. 10.
Figure 13:
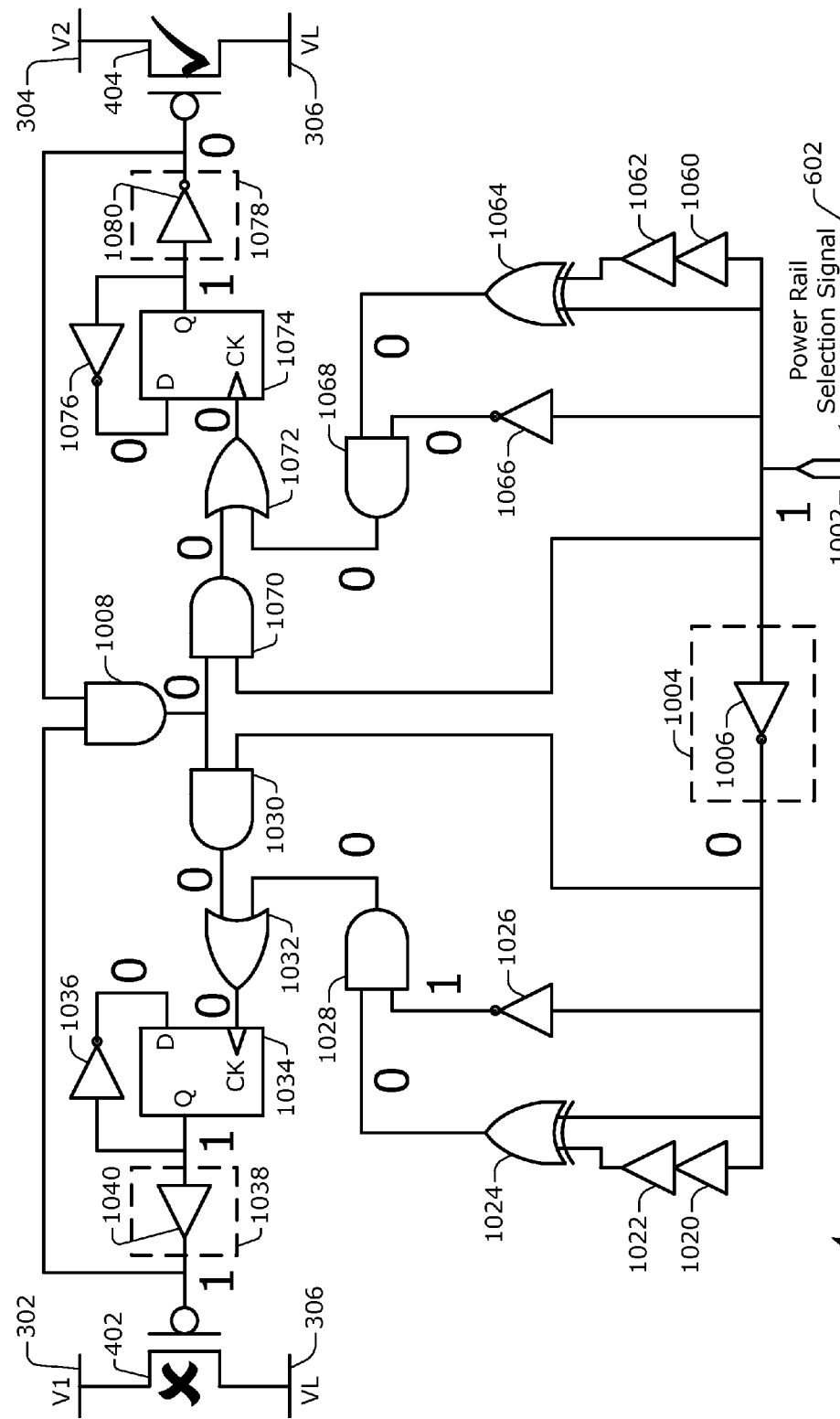
FIG. 13 illustrates an example second operational steady-state condition of the power-mux tile of FIG. 10.
Figure 14:
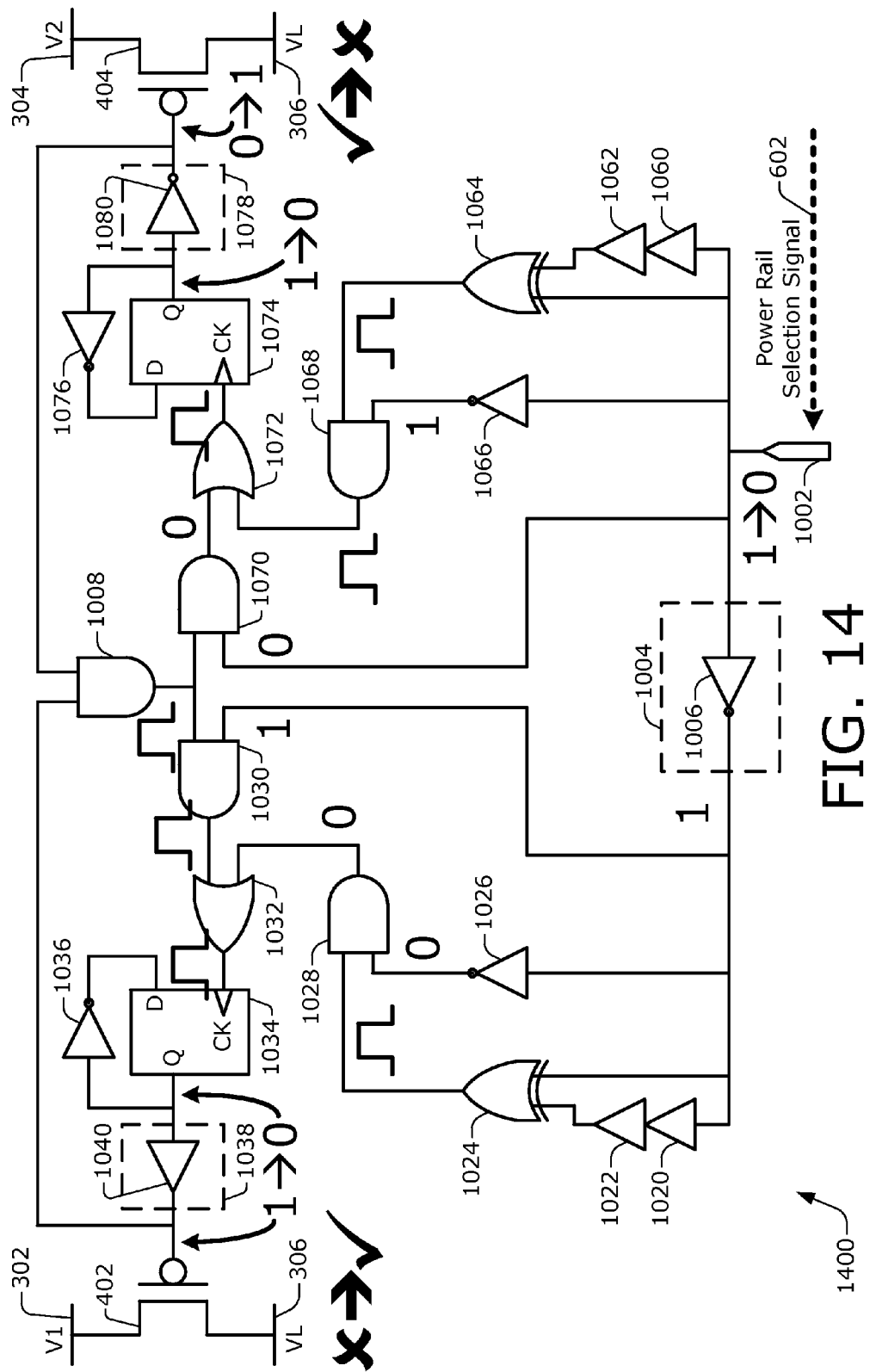
FIG. 14 illustrates another example transitional state of the power-mux tile of FIG. 10.

FIGS. 10-14 show an example power-mux tile including a delay circuit. FIG. 10 illustrates circuit devices and interconnections thereof for a power-mux tile 210. An example delay circuit 410 is explicitly indicated in FIG. 10. FIG. 11 shows a first operational steady-state condition of the power-mux tile 210 in which the first transistor 402 is on and the second transistor 404 is off. FIG. 12 shows an example transitional state of the power-mux tile 210 to illustrate a transition from the first operational steady-state condition of FIG. 11 to a second operational steady-state condition of FIG. 13. FIG. 13 shows the second operational steady-state condition of the power-mux tile 210 in which the first transistor 402 is off and the second transistor 404 is on. FIG. 14 shows an example transitional state of the power-mux tile 210 to illustrate a transition from the second operational steady-state condition of FIG. 13 back to the first operational steady-state condition of FIG. 11.

The delay circuit 410 is an example part of power-mux circuitry 310 of FIG. 3. As described below, the delay circuit 410 may comprise self-timed circuitry. For example, the delay circuit 410 may have an operational timing that is independent of a periodic clock signal. The circuit devices as described below in FIGS. 10-14 operate without using a periodic clock signal for timing purposes. Additionally or alternatively, the delay circuit 410 may include multiple circuit devices that have a joint operational timing that is based at least partially on an intrinsic speed of individual ones of the multiple circuit devices. A joint operational timing may represent a combined total time for an operation or a time period resulting from operations of the multiple circuit devices that are interrelated. Each of the illustrated or described signal flows of FIGS. 11-14 may represent an example of a delay signal 702 of FIG. 7.

FIG. 10 depicts an example power-mux tile 210 that includes two transistors 402 and 404 and a delay circuit 410. More specifically, the power-mux tile 210 includes a first transistor 402, a second transistor 404, and the delay circuit 410. The first transistor 402 is coupled between a first voltage 302 and a load voltage 306. The second transistor 404 is coupled between a second voltage 304 and the load voltage 306. The first voltage 302, the second voltage 304, and the load voltage 306 correspond respectively to the first power rail 202, the second power rail 204, and the load power rail 206, each of FIG. 4. The delay circuit 410 enables power switching for the load power rail 206 from the first power rail 202 to the second power rail 204 independently of a voltage level differential between the first voltage 302 and the second voltage 304.

As illustrated, the delay circuit 410 includes a power rail selection decoder 1004, a flip-flop 1034, a configurable delay device 1038, a flip-flop 1074, a configurable delay device 1078, a node 1090, a node 1092, a node 1094, a node 1096, and multiple other circuit devices that are described below. The node 1090, the node 1092, the node 1094, and the node 1096 are individually identified to facilitate an explanation below of FIG. 15, which includes multiple power-mux tiles 210 that are separated into multiple power-mux tile zones. A voltage at the node 1094 controls whether the first transistor 402 is on or off, and a voltage at the node 1096 controls whether the second transistor 404 is on or off.

The flip-flop 1034 and the flip-flop 1074 may comprise, for example, D-type flip-flops having a clocking or triggering input, a data input "D", and a data output "Q." The configurable delay device 1038 or the configurable delay device 1078 may have a separately adjustable operational period that enables a delay time to be increased or decreased. The power rail selection decoder 1004 provides a means for decoding a power rail selection signal 602 that is indicative of a selected power source for the load power rail 206 of FIG. 4.

In one or more embodiments, an input 1002 is applied at the node 1090. The node 1090 is coupled to an input of the power rail selection decoder 1004. The power rail selection decoder 1004 may be implemented, for example, as an inverter 1006. An output of the power rail selection decoder 1004 is coupled to an input of an AND gate 1030, an input to an inverter 1026, an input to an XOR gate 1024, and an input of a buffer 1020. An output of the buffer 1020 is coupled to an input of a buffer 1022, and an output of the buffer 1022 is coupled to another input of the XOR gate 1024. The buffer 1020, the buffer 1022, and the XOR gate 1024 may operate in concert to produce a pulse at an output of the XOR gate 1024 as described herein with particular reference to FIG. 12.

The output of the XOR gate 1024 and an output of the inverter 1026 are coupled to two separate inputs of an AND gate 1028. An output of the AND gate 1028 and an output of the AND gate 1030 are coupled to two separate inputs of an OR gate 1032. An output of the OR gate 1032 is coupled to the clocking input of the flip-flop 1034. The data output of the flip-flop 1034 is coupled to an input of an inverter 1036, and an output of the inverter 1036 is coupled to the data input of the flip-flop 1034 to invert the data output of the flip-flop 1034 each time the clocking input is triggered. The data output of the flip-flop 1034 is also coupled to an input of the configurable delay device 1038. A delay time imposed by the configurable delay device 1038 may be adjustable after fabrication of an IC to account for differences in process, voltage, or temperature (PVT), or other circuit operational parameters. For example, an operational timing of a delay circuit 410 may be set to be sufficiently long to ensure that the first transistor 402 is off before the second transistor 404 is turned on across the PVT in which the IC is designed to operate. The configurable delay device 1038 may be implemented, for example, as a buffer 1040. An output of the configurable delay device 1038 is coupled to the node 1094. The node 1094 is coupled to the gate terminal of the first transistor 402 and to an input of an AND gate 1008.

As shown, the right half of the delay circuit 410 appears to be a mirror image of the left half except for a few features. For example, the right half processes the power rail selection signal 602 from the node 1090 without modification by the power rail selection decoder 1004. Also, the configurable delay device 1078 is implemented differently as compared to the configurable delay device 1038. Starting at the input 1002, the node 1090 is coupled to an input of an AND gate 1070, an input of an inverter 1066, an input to an XOR gate 1064, and an input of a buffer 1060. An output of the buffer 1060 is coupled to an input of a buffer 1062, and an output of the buffer 1062 is coupled to another input of the XOR gate 1064. The buffer 1060, the buffer 1062, and the XOR gate 1064 may operate in concert to produce a pulse at an output of the XOR gate 1064.

The output of the XOR gate 1064 and an output of the inverter 1066 are coupled to two separate inputs of an AND gate 1068. An output of the AND gate 1068 and an output of the AND gate 1070 are coupled to two separate inputs of an OR gate 1072. An output of the OR gate 1072 is coupled to the clocking input of the flip-flop 1074. The data output of the flip-flop 1074 is coupled to an input of an inverter 1076, and an output of the inverter 1076 is coupled to the data input of the flip-flop 1074 to invert the data output of the flip-flop 1074 each time the clocking input is triggered. The data output of the flip-flop 1074 is also coupled to an input of the configurable delay device 1078. A delay time imposed by the configurable delay device 1078 may be adjustable after fabrication of an IC. The configurable delay device 1078 may be implemented as, for example, an inverter 1080 that has an adjustable operational period in addition to being configured to complement an input value for the output. An output of the configurable delay device 1078 is coupled to the node 1096. The node 1096 is coupled to the gate terminal of the second transistor 404 and to another input of the AND gate 1008. An output of the AND gate 1008 is coupled to the node 1092, and the node 1092 is coupled to another input of the AND gate 1030 and to another input of the AND gate 1070.

FIG. 11 illustrates an example first operational steady-state condition 1100 of the power-mux tile 210 of FIG. 10. With the first operational steady-state condition 1100, the first transistor 402 is on as indicated by the "check mark," and the second transistor 404 is off as indicated by the "X mark." The first operational steady-state condition 1100 may represent a condition after a reset, such as if the first voltage 302 is a standard operational voltage level and the second voltage 304 is a retention or reduced voltage level. For this example, a zero "0" represents a logic low and a low voltage, and a one "1" represents a logic high and a high voltage. For PFETs, a zero "0" or low voltage turns a PFET on, and a one "1" or high voltage turns a PFET off.

As illustrated, a zero is present at the input 1002 of the delay circuit 410. The zero is inverted to a one by the inverter 1006. The one applied to the two inputs of the XOR gate 1024 and to the input of the inverter 1026 produces a zero at both outputs. These two zeros are input to the AND gate 1028 and produce a zero. Two zeros are input to the OR gate 1032, and a zero results at the output of the OR gate 1032. The zero is applied to the clocking input of the flip-flop 1034, which holds the data output of the flip-flop 1034 at a value of zero. The zero is inverted by the inverter 1036 to produce a one at the data input of the flip-flop 1034 for a next triggering event. The zero at the data output of the flip-flop 1034 is applied to the gate of the first transistor 402 by the buffer 1040 of the configurable delay device 1038. This zero at the output of the buffer 1040 is also applied to an input of the AND gate 1008, which results in a zero at an input of the AND gate 1030 and at the other input of the OR gate 1032.

The zero at the input 1002 is also processed by the circuit devices on the right half of the delay circuit 410. A one is produced by the inverter 1066 at an input of the AND gate 1068, but the other input to the AND gate 1068 is zero due to the exclusive-or operation of the XOR gate 1064, so the output of the AND gate 1068 is zero. Zero values are also otherwise present at the inputs and outputs of the circuit devices on the right half of the delay circuit 410 except at the output side of the flip-flop 1074. The data output of the flip-flop 1074 is zero. However, the configurable delay device 1078 is implemented as the inverter 1080, so the output of the configurable delay device 1078 is a one. This one value is applied to the gate terminal of the second transistor 404 so that the second transistor 404 is in an off state. The one at the output of the configurable delay device 1078 is also applied to the other input of the AND gate 1008.

FIG. 12 illustrates an example transitional state 1200 of the power-mux tile 210 of FIG. 10. As part of the transitional state 1200, the first transistor 402 is transitioning from being on to being off, and the second transistor 404 is transitioning from being off to being on. The power rail selection signal 602 transitions from zero to one at the input 1002. The inverter 1006 of the power rail selection decoder 1004 decodes the one of the power rail selection signal 602 and produces a zero. The zero is provided to an input of the AND gate 1030 and inverted by the inverter 1026 to provide a one at an input of the AND gate 1028. The zero at the output of the inverter 1006 is provided to the right input of the XOR gate 1024. Because the propagation of this zero is delayed by buffers 1020 and 1022, the left input of the XOR gate 1024 temporarily remains at the one present during the previous steady-state condition of FIG. 11 and prior to the transition of the power rail selection signal 602. During the buffering delay produced by the buffers 1020 and 1022, the XOR gate 1024 produces a value of one, likewise temporarily. The temporary nature of the one value at the output of the XOR gate 1024 results in the creation of a pulse as illustrated. Hence, the buffer 1020, the buffer 1022, and the XOR gate 1024 operate together as a pulse generator responsive to a transition at the input 1002. The pulse includes a rising edge and a falling edge. The pulse width is sufficient to trigger the clocking input of the flip-flop 1034.

The pulse that is output from the XOR gate 1024 is provided to the other input of the AND gate 1028. The AND gate 1028 outputs the pulse to an input of the OR gate 1032. The OR gate 1032 forwards the pulse to an output thereof and applies the pulse to the clocking input of the flip-flop 1034. During the first operational steady-state condition 1100 of FIG. 11, a zero is present at the data output of the flip-flop 1034, and a one is present at the data input due to the inverter 1036. Responsive to the rising edge of the pulse triggering the clocking input of the flip-flop 1034, the one at the data input of the flip-flop 1034 is transferred to the data output. After a delay due to the configurable delay device 1038, the value at the output of the buffer 1040 and at the gate terminal of the first transistor 402 transitions from zero to one. The transition of the voltage at the gate terminal of the first transistor 402 from zero to one turns off the first transistor 402.

The one at the gate terminal of the first transistor 402 is provided to an input of the AND gate 1008. Until the voltage at the gate terminal of the first transistor 402 is switched to one, the AND gate 1008 in part prevents a change to an operational state of the second transistor 404 inasmuch as the clocking input of the flip-flop 1074 is not triggered. The delay circuit 410 is effectively controlling an operational state of the second transistor 404 based on a voltage that controls an operational state of the first transistor 402. Additionally, the inverter 1066 provides a zero to an input of the AND gate 1068 to further prevent a pulse signal that is capable of triggering the clocking input of the flip-flop 1074 from propagating to the flip-flop 1074. Continuing with the AND gate 1008, because the voltage at the gate terminal of the second transistor 404 is still one at the time during transitional state 1200 at which the first transistor 402 switches from being on to being off, the AND gate 1008 outputs a one, which is represented by a rising edge of a signal. The signal becomes a pulse as illustrated after the second transistor 404 turns on to create a falling edge for the pulse, as is explained below. The rising edge that is output from the AND gate 1008 is provided to an input of the AND gate 1070. Due to the zero-to-one transition at the input 1002, the AND gate 1070 has a one at the other input thereof. The rising edge is provided at the output of the AND gate 1070 and then to an input of the OR gate 1072.

The OR gate 1072 forwards the rising edge to an output thereof and applies the rising edge to the clocking input of the flip-flop 1074. During the first operational steady-state condition 1100 of FIG. 11, a zero is present at the data output of the flip-flop 1074, and a one is present at the data input due to the inverter 1076. The rising edge of the signal triggers the clocking input of the flip-flop 1074, so the one at the data input of the flip-flop 1074 is transferred to the data output of the flip-flop 1074. The value at the input of the configurable delay device 1078 thus transitions from zero to one. After a delay due to the configurable delay device 1078, the value at the output of the inverter 1080 and at the gate terminal of the second transistor 404 transitions from one to zero. The transition of the voltage at the gate terminal of the second transistor 404 from one to zero turns on the second transistor 404. The zero at the gate terminal of the second transistor 404 is provided to the other input of the AND gate 1008, which creates the falling edge of the illustrated pulse.

FIG. 13 illustrates an example second operational steady-state condition 1300 of the power-mux tile 210 of FIG. 10. The second operational steady-state condition 1300 reflects a condition after the transitional state 1200 of FIG. 12. The pulse has passed on the left side of the delay circuit 410. The transition from one to zero at the gate terminal of the second transistor 404 has been propagated to and through the AND gate 1008 such that the AND gate 1070 and the OR gate 1072 have reached a steady-state condition. There is a zero at the output of the AND gate 1070 and at the output of the OR gate 1072.

With the second operational steady-state condition 1300, the input and the output of the configurable delay device 1038 are at one. The input of the configurable delay device 1078 is also at one, but the output of the configurable delay device 1078 is at zero. The input 1002 is at one, and the output of the inverter 1026 is at one. Other nodes are at zero. The first transistor 402 is off, and the second transistor 404 is on. The delay circuit 410 is ready for a transition to turn the first transistor 402 on and to turn the second transistor 404 off responsive to a change in the power rail selection signal 602.

FIG. 14 illustrates an example transitional state 1400 of the power-mux tile of FIG. 10. As part of the transitional state 1400, the first transistor 402 is transitioning from being off to being on, and the second transistor 404 is transitioning from being on to being off. The power rail selection signal 602 transitions from one to zero at the input 1002. The inverter 1006 of the power rail selection decoder 1004 decodes the zero of the power rail selection signal 602 and produces a one on the left side of the delay circuit 410. On the right side of the delay circuit 410, the zero is provided to an input of the AND gate 1070 and inverted by the inverter 1066 to provide a one to an input of the AND gate 1068. The zero at the input 1002 is provided to the left input of the XOR gate 1064. Because the propagation of this zero is delayed by buffers 1060 and 1062, the right input of the XOR gate 1064 temporarily remains at the one existing during the second operational steady-state condition 1300 of FIG. 13 and prior to the transition of FIG. 14. During the buffering delay produced by the buffers 1060 and 1062, the XOR gate 1064 produces a value of one temporarily. The temporary nature of the one value at the output of the XOR gate 1064 results in the creation of a pulse having a rising edge and a falling edge. Hence, the buffer 1060, the buffer 1062, and the XOR gate 1064 operate together as a pulse generator responsive to a transition of the power rail selection signal 602 at the input 1002.

The pulse that is output from the XOR gate 1064 is provided to the other input of the AND gate 1068. The pulse propagates through the AND gate 1068 and through the OR gate 1072, and the rising edge of the pulse triggers the clocking input of the flip-flop 1074. The zero at the data input of the flip-flop 1074 is transferred to the data output to transition the input of the configurable delay device 1078 from one to zero. After a delay due to the configurable delay device 1078 and an inversion due to the inverter 1080 thereof, the value at the output of the inverter 1080 and at the gate terminal of the second transistor 404 transitions from zero to one. The transition of the voltage at the gate terminal of the second transistor 404 from zero to one turns off the second transistor 404.

The one at the gate terminal of the second transistor 404 is provided to an input of the AND gate 1008. Until the voltage at the gate terminal of the second transistor 404 is switched to a one, the AND gate 1008 in part prevents a change to an operational state of the first transistor 402 inasmuch as the clocking input of the flip-flop 1034 is not triggered. Additionally, the inverter 1026 provides a zero to an input of the AND gate 1028 to further prevent a signal pulse that is capable of triggering the clocking input of the flip-flop 1034 from reaching the flip-flop 1034. Continuing with the AND gate 1008, because the voltage at the gate terminal of the first transistor 402 is still one at the time of the transitional state 1400 at which the second transistor 404 switches from on to off, the output of the AND gate 1008 provides a one, which is represented by a rising edge of a signal, to an input of the AND gate 1030. The signal subsequently becomes a pulse with a falling edge as is explained below. Due to the one-to-zero transition at the input 1002 and the inverter 1006 of the power rail selection decoder 1004, the AND gate 1030 has a one at the other input thereof. The rising edge from the output of the AND gate 1008 is therefore provided at the output of the AND gate 1030 and to an input of the OR gate 1032.

The OR gate 1032 forwards the rising edge of the signal to an output thereof and applies the rising edge to the clocking input of the flip-flop 1034. During the second operational steady-state condition 1300 of FIG. 13, a one is present at the data output of the flip-flop 1034, and a zero is present at the data input due to the inverter 1036. In response to the rising edge that triggers the clocking input of the flip-flop 1034, the zero at the data input of the flip-flop 1034 is transferred to the data output. The data output thus transitions from one to zero. After a delay due to the configurable delay device 1038, the value at the output of the buffer 1040 and at the gate terminal of the first transistor 402 transitions from one to zero. The transition of the voltage at the gate terminal of the first transistor 402 from one to zero turns on the first transistor 402. The zero at the gate terminal of the first transistor 402 is provided to the other input of the AND gate 1008, which creates the falling edge of the illustrated pulse by returning the output of the AND gate 1008 to zero.

Figure 15:
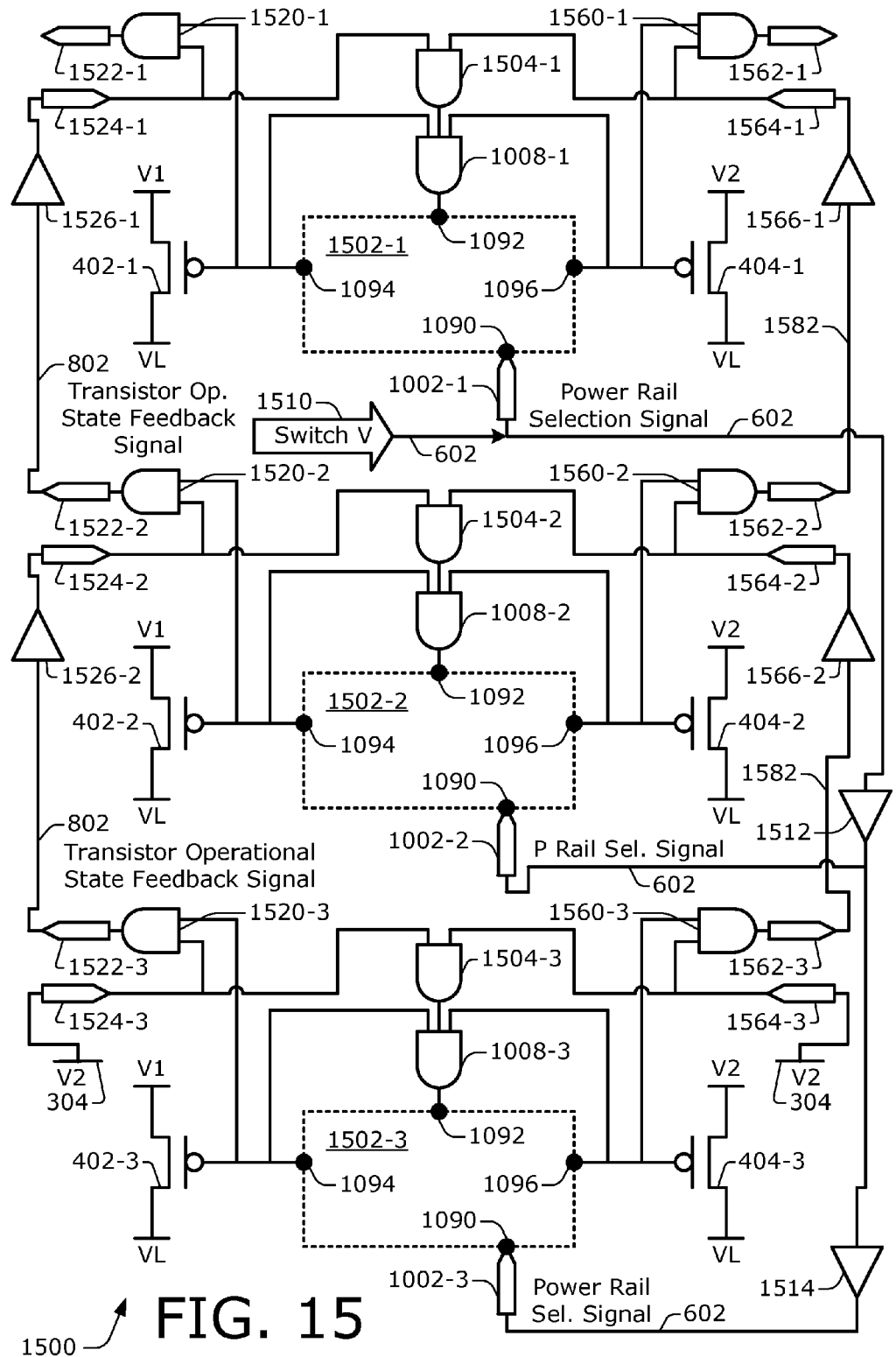
FIG. 15 depicts a portion of example power-mux circuitry that is at least partially external to power-mux tiles.

FIG. 15 depicts at 1500 generally an example of power-mux circuitry that is at least partially external to power-mux tiles. At least a portion of the power-mux circuitry 310 of FIG. 3 that is external to the power-mux tiles 210 of FIGS. 3 and 4 is shown in FIG. 15. First, second, and third power-mux tile zones are depicted, each of which is indicated by a reference number suffix of "4," "–2," or "–3," respectively. Each power-mux tile of a given power-mux tile zone is partially depicted with reference to FIG. 10 by identifying the node 1090, the node 1092, the node 1094, and the node 1096. Circuit devices that are within these four nodes as shown in FIG. 10 are omitted from FIG. 15 to avoid obscuring other described aspects, but the circuit devices between nodes 1090, 1092, 1094, and 1096 are represented by interior circuitry 1502-1, interior circuitry 1502-2, and interior circuitry 1502-3, each of which may include at least a portion of the delay circuitry 410 of FIG. 4.

For a first power-mux tile of an upper or first power-mux tile zone, there is interior circuitry 1502-1, a first transistor 402-1, a second transistor 404-1, and an AND gate 1008-1. For a second power-mux tile of a middle or second power-mux tile zone, there is interior circuitry 1502-2, a first transistor 402-2, a second transistor 404-2, and an AND gate 1008-2. For a third power-mux tile of a lower or third power-mux tile zone, there is interior circuitry 1502-3, a first transistor 402-3, a second transistor 404-3, and an AND gate 1008-3.

A power rail selection signal 602 is propagated across the three power-mux tile zones. An input 1002-1, an input 1002-2, an input 1002-3, a buffer 1512, and a buffer 1514 support or enable application or propagation of the power rail selection signal 602. A command 1510 to switch power rails or voltages is provided to the chained array of power-mux tiles based, for example, on a desire to start a power down or retention mode by switching from a relatively higher, or mission level, first voltage 302 of FIG. 3 to a relatively lower, or retention level, second voltage 304. The command 1510 may alternatively be to switch power rails or voltages based, for example, on a desire to terminate a power down or retention mode by switching from a relatively lower voltage to a relatively higher voltage. The power rail selection signal 602 is applied to the input 1002-1 and the node 1090 of the interior circuitry 1502-1. The interior circuitry 1502-1 may operate as described herein with particular reference to FIGS. 10-14 to switch which of the first transistor 402-1 or the second transistor 404-1 is on.

The power rail selection signal 602 is propagated to an input of the buffer 1512, which operates to delay the propagation. An output of the buffer 1512 is coupled to the input 1002-2, and the interior circuitry 1502-2 switches transistor operational states in response to the power rail selection signal 602. The power rail selection signal 602 is further propagated to an input of the buffer 1514, which delays the power rail selection signal 602 during propagation between the second and third power-mux tile zones. An output of the buffer 1514 is coupled to the input 1002-3, and the interior circuitry 1502-3 responds to the power rail selection signal 602 accordingly. Although not explicitly indicated in FIG. 15, the buffer 1512 or the buffer 1514 may have a configurable delay. The buffer 1512 or the buffer 1514 provide a means for propagating a power rail selection signal 602 to multiple power-mux tiles.

The third power-mux tile zone includes an input 1524-3 and an input 1564-3. The input 1524-3 and the input 1564-3 are both tied to the second voltage 304. The input 1524-3 and the input 1564-3 are fed to an AND gate 1504-3 to ensure that the second voltage 304 is powered and to enable switching to the second voltage 304 due to the inclusion of an output of the AND gate 1504-3 as an input to the AND gate 1008-3. After the first transistor 402-3 is turned off by setting a voltage at the gate terminal thereof to one, both inputs of an AND gate 1520-3 are one. Consequently, an output 1522-3 of the third power-mux tile zone is one and is provided to an input of a buffer 1526-2 as a transistor operational state feedback signal 802, which is indicative here that the first transistor 402-3 is in an OFF operational state. An output of the buffer 1526-2, which may be delayed, serves as an input 1524-2 for the second power-mux tile zone. The input 1524-2, which has a value of one, is coupled to an input of an AND gate 1504-2.

Because the second transistor 404-3 of the third power-mux tile zone was previously in an OFF operational state with a gate terminal value of one, an output of an AND gate 1560-3 is one. This one from the output of the AND gate 1560-3 is fed to an output 1562-3 of the third power-mux tile zone. The output 1562-3 is routed as state signal 1582 through a buffer 1566-2, which may introduce a delay, to an input 1564-2 of the second power-mux tile zone. The input 1564-2, which has a value of one here, is coupled to an input of the AND gate 1504-2. Thus, the transistor operational state feedback signal 802 is input to the AND gate 1504-2 via the input 1524-2, and the state signal 1582 is also input to the AND gate 1504-2. With both inputs of the AND gate 1504-2 being one, an output of the AND gate 1504-2 has a value of one, which is coupled to an input of the AND gate 1008-2. An output of the AND gate 1008-2 coincides with the node 1092, so a pulse as shown in FIG. 12 may propagate within the interior circuitry 1502-2 to turn the second transistor 404-2 on. Circuit devices forming a path of travel for the transistor operational state feedback signal 802 provide a means for propagating the transistor operational state feedback signal 802 to multiple power-mux tiles.

An output 1522-2, an output 1562-2, an AND gate 1520-2, and an AND gate 1560-2 of the second power-mux tile zone may operate analogously to the output 1522-3, the output 1562-3, the AND gate 1520-3, and the AND gate 1560-3, respectively, of the third power-mux tile zone. Furthermore, a buffer 1526-1 and a buffer 1566-1 may operate analogously to the buffer 1526-2 and the buffer 1566-2, respectively. An input 1524-1, an input 1564-1, an AND gate 1504-1, an output 1522-1, an output 1562-1, an AND gate 1520-1, and an AND gate 1560-1 of the first power-mux tile zone may operate analogously to the input 1524-2, the input 1564-2, the AND gate 1504-2, the output 1522-2, the output 1562-2, the AND gate 1520-2, and the AND gate 1560-2, respectively, of the second power-mux tile zone.

Although not explicitly indicated in FIG. 15, the buffer 1526-2, the buffer 1526-1, the buffer 1566-2, or the buffer 1566-1 may have a configurable delay. Although the power rail selection signal 602 is shown being propagated across multiple power-mux tiles using a single pathway, the power rail selection signal 602 may alternatively be propagated using two or more pathways. Also, although separate, parallel pathways are shown for propagating the transistor operational state feedback signal 802, one pathway or more than two pathways may alternatively be employed to propagate the transistor operational state feedback signal 802.

Figure 16:
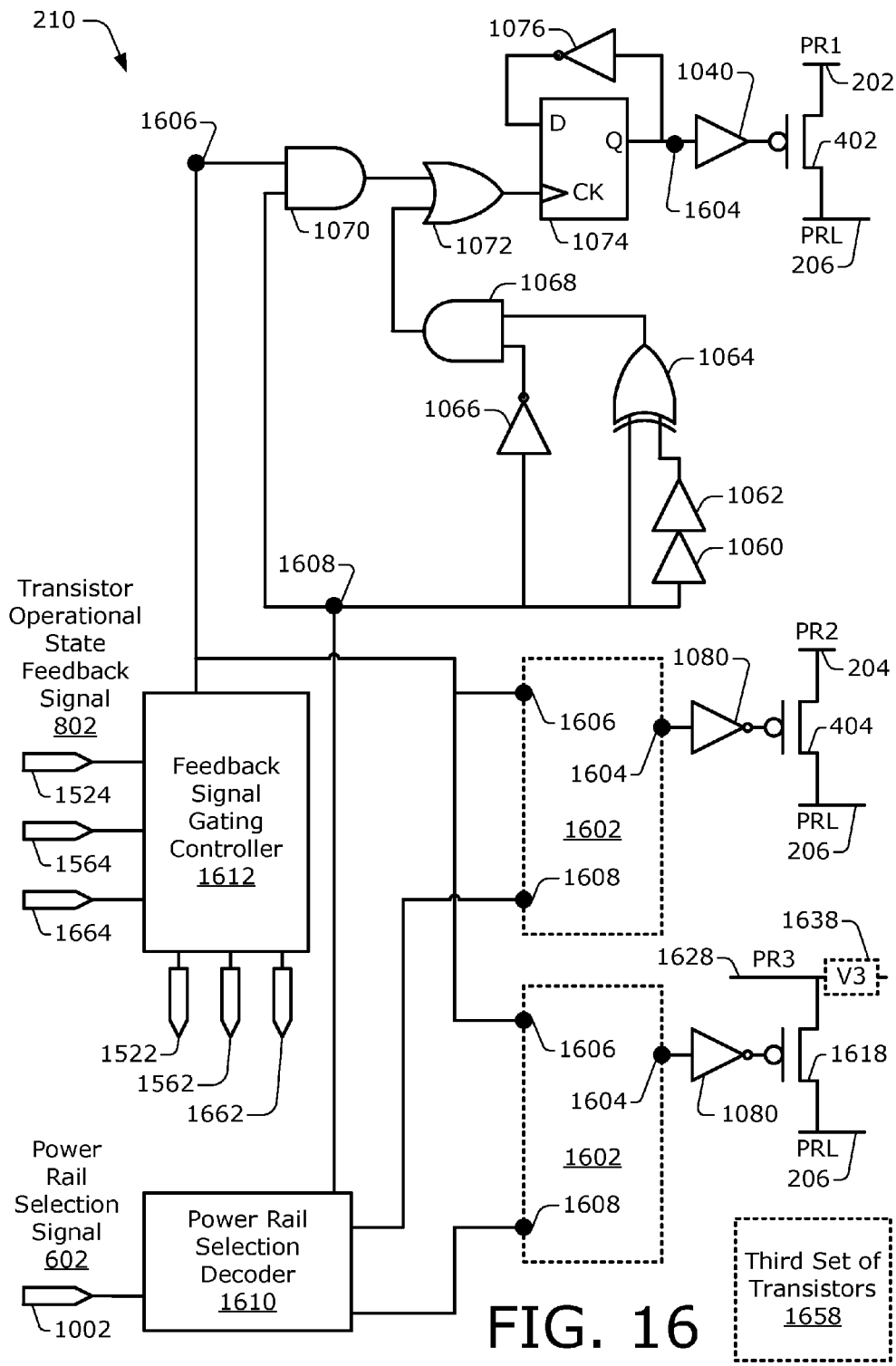
FIG. 16 depicts an example power-mux tile that includes three transistors that are respectively associated with three power rails.

FIG. 16 depicts an example power-mux tile 210 that includes three transistors that are respectively associated with three power rails. IC power rail multiplexing is described herein above primarily in terms of switching between two different power rails, or in terms of 2-to-1 multiplexing. However, the principles disclosed herein are applicable generally to n-to-1 multiplexing of power rails. An example of 3-to-1 multiplexing of power rails is shown in FIG. 16.

As illustrated, there are three transistors: the first transistor 402, the second transistor 404, and a third transistor 1618. The first transistor 402 is coupled to the first power rail 202, with the first power rail 202 corresponding to the first voltage 302 of FIG. 3. The second transistor 404 is coupled to the second power rail 204, with the second power rail 204 corresponding to the second voltage 304 of FIG. 3. The third transistor 1618 is coupled to a third power rail 1628 (PR3), with the third power rail 1628 corresponding to a third voltage 1638. The third transistor 1618 is included as one of a third set of transistors 1658 that may be distributed, for an example 3-to-1 multiplexing of power rails scenario, across multiple power-mux tiles as is shown in FIG. 3 with regard to the first set of transistors 312 and the second set of transistors 314.

The circuit devices shown in FIG. 16 that are associated with the first transistor 402 are described herein above with reference to FIGS. 10-14. In FIG. 16, three nodes are added to these circuit devices: a node 1604, a node 1606, and a node 1608. Circuit devices that are within these three nodes as shown in an upper portion of FIG. 16 are omitted from middle and lower portions of FIG. 16 to avoid obscuring other described aspects, but the circuit devices between nodes 1604, 1606, and 1608 are represented by internal circuitry 1602. Internal circuitry 1602 is associated with the second transistor 404 and with the third transistor 1618 at the middle and lower portions, respectively, as shown.

In one or more embodiments, the power-mux tile 210 of FIG. 16 includes a power rail selection decoder 1610. A power rail selection signal 602 is coupled to an input 1002 for the power-mux tile 210. The input 1002 is coupled to an input of the power rail selection decoder 1610. The power rail selection signal 602 may be comprised of one or more bits. The power rail selection decoder 1610 has one or more outputs that are coupled to the three nodes 1608 that are individually associated with the first transistor 402, the second transistor 404, and the third transistor 1618. The power rail selection decoder 1610 provides a means for decoding the power rail selection signal 602 to cause one of the three transistors to be in an ON operational state and the other two transistors to be in an OFF operational state responsive to the power rail selection signal 602.

The power-mux tile 210 of FIG. 16 further includes a feedback signal gating controller 1612. The feedback signal gating controller 1612 receives from an upstream consecutive power-mux tile, which is not shown in FIG. 16, a transistor operational state feedback signal 802 at one or more of the input 1524, the input 1564, or an input 1664. The feedback signal gating controller 1612 provides to a downstream consecutive power-mux tile, which is not shown in FIG. 16, a transistor operational state feedback signal 802 via one or more of the output 1522, the output 1562, or an output 1662. The feedback signal gating controller 1612 has at least one output that is coupled to the node 1606 for each of the three transistors. The node 1606 is coupled to an input of the AND gate 1070. An output of the AND gate 1070 leads to the clocking input of the flip-flop 1074 via the OR gate 1072. The feedback signal gating controller 1612 is configured to permit a transistor state to be switched from on to off or vice versa. More specifically, the feedback signal gating controller 1612 is configured to enable a pulse input that arrives at the OR gate 1072 to trigger the clocking input of the flip-flop 1074, based also on a decoding signal from the power rail selection decoder 1610 that is coupled to another input of the AND gate 1070 via the node 1608 and that produces a pulse via the buffer 1060, the buffer 1062, and the XOR gate 1064.

In an example 3-to-1 power rail multiplexing implementation, an IC may include the first power rail 202, the second power rail 204, and the third power rail 1628. The IC may also include the first set of transistors 312 of FIG. 3 including first transistors 402 that are coupled to the first power rail 202, the second set of transistors 314 including second transistors 404 that are coupled to the second power rail 204, and the third set of transistors 1658 including third transistors 1618 that are coupled to the third power rail 1628. The IC may further include power-mux circuitry 310 that is configured to switch access to power for the load power rail 206 from the first power rail 202 to the third power rail 1628 by sequentially turning off the first transistors 402 and then sequentially turning on the third transistors 1618. For example, the power multiplexer circuitry 310 may be configured to disconnect the load power rail 206 from the first power rail 202 and to connect the load power rail 206 to the third power rail 1628 by sequentially turning off the first transistors 402 of the first set of transistors 312 and then sequentially turning on the third transistors 1618 of the third set of transistors 1658.

Figure 17:
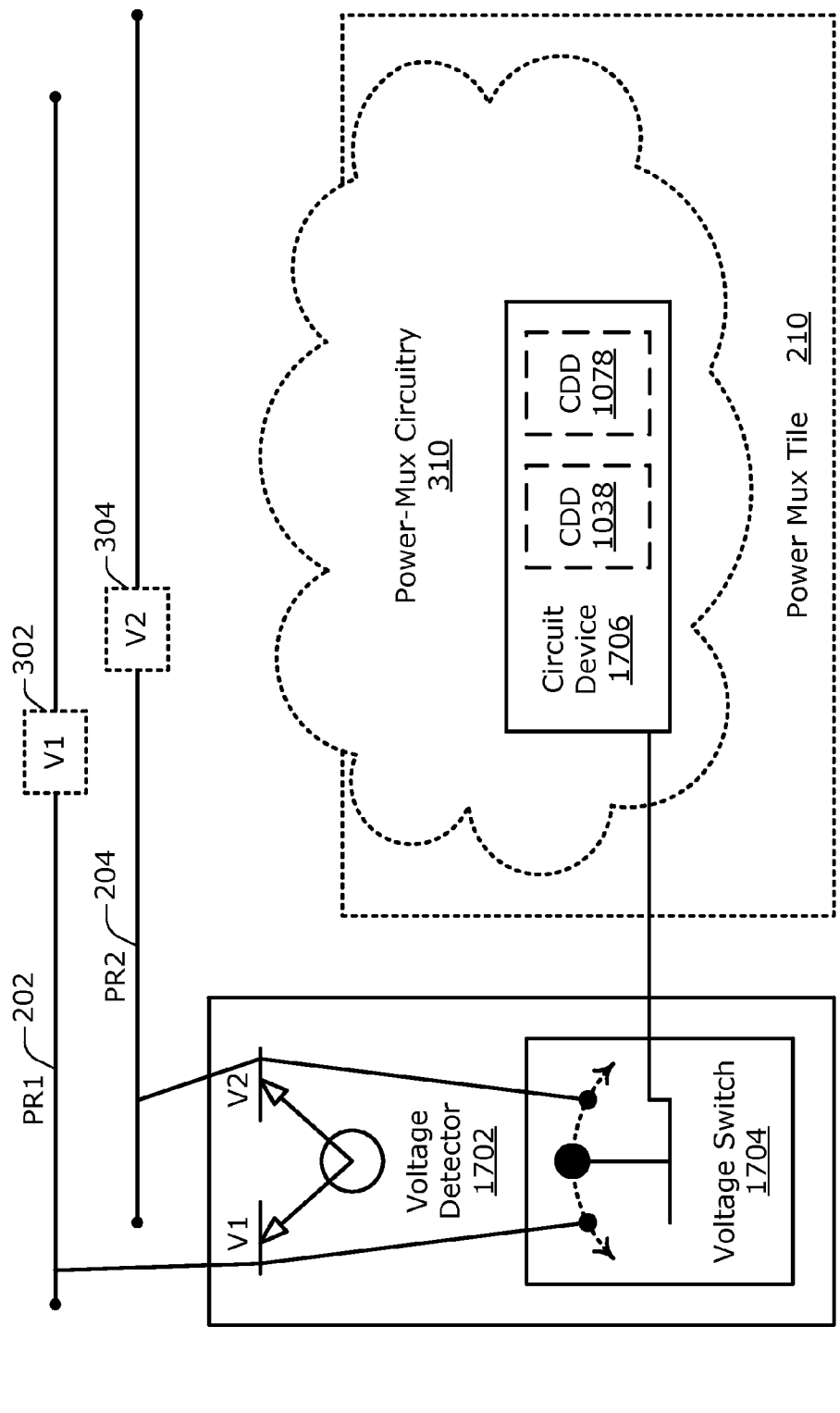
FIG. 17 depicts an example approach to providing a voltage to power-mux circuitry that includes a voltage detection mechanism.

FIG. 17 depicts an example approach to powering power-mux circuitry 310 that includes a voltage detection mechanism 1700. As illustrated, the voltage detection mechanism 1700 includes a voltage detector 1702 in conjunction with a power-mux tile 210. The voltage detector 1702 includes a voltage switch 1704. The power-mux tile 210 includes at least part of power-mux circuitry 310, such as a delay circuit 410 of FIG. 4. The power-mux circuitry 310 includes multiple circuit devices, such as those described herein with particular reference to FIG. 10, that are represented by a circuit device 1706. A specific example of a circuit device 1706 is a configurable delay device 1038 (CDD) and a configurable delay device 1078. The voltage detector 1702 is coupled to the first power rail 202, which corresponds to the first voltage 302, and is coupled to the second power rail 204, which corresponds to the second voltage 304.

In one or more embodiments, the voltage detector 1702 is configured to detect respective voltage levels of the first power rail 202 and the second power rail 204. In operation, the voltage switch 1704 is activated to couple a detected voltage level, such as a higher voltage of the first voltage 302 or the second voltage 304, to the circuit device 1706. For example, the voltage detector 1702 may power the configurable delay device 1038 or the configurable delay device 1078 with the greater of the first voltage 302 or the second voltage 304.

In an example implementation, the voltage detector 1702 is configured to detect a higher voltage between the first voltage 302 corresponding to the first power rail 202 and the second voltage 304 corresponding to the second power rail 204. The voltage detector 1702 is further configured to power at least part of the power-mux circuitry 310 using the detected higher voltage.

Figure 18:
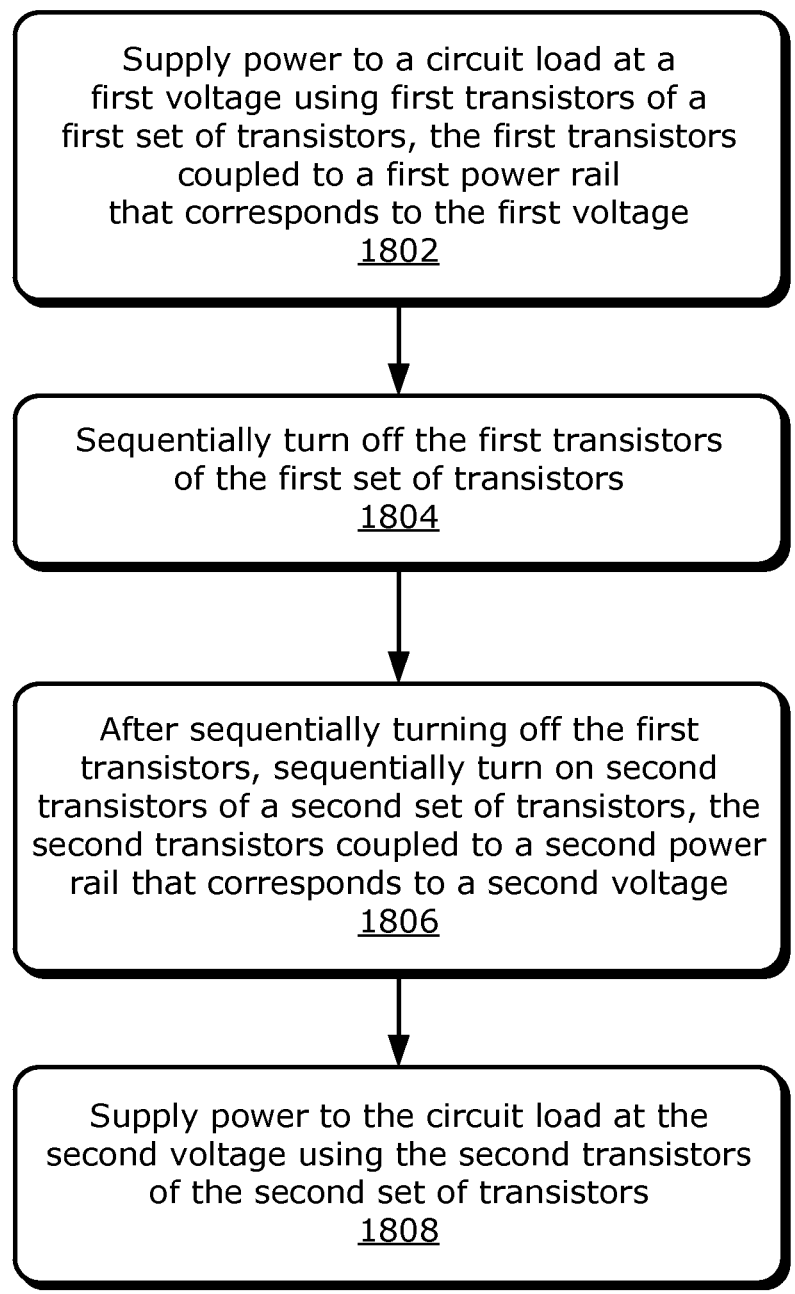
FIG. 18 is a flow diagram illustrating an example process for IC power rail multiplexing.

FIG. 18 is a flow diagram illustrating an example process 1800 for IC power rail multiplexing. Process 1800 is described in the form of a set of blocks 1802-1808 that specify operations that may be performed. However, operations are not necessarily limited to the order shown in FIG. 18 or described herein, for the operations may be implemented in alternative orders or in fully or partially overlapping manners. Operations represented by the illustrated blocks of process 1800 may be performed by an IC, such as an IC 110 of FIG. 1. More specifically, the operations of process 1800 may be performed by multiple power-mux tiles along with power-mux circuitry in conjunction with multiple power rails, such as by multiple power-mux tiles 210-1 to 210-4 along with power-mux circuitry 310 in conjunction with a first power rail 202 and a second power rail 204 of FIG. 3.

At block 1802, power is supplied to a circuit load at a first voltage using first transistors of a first set of transistors, with the first transistors coupled to a first power rail that corresponds to the first voltage. For example, circuitry of an IC 110 may supply power to a circuit load 208 at a first voltage 302 using first transistors 402 of a first set of transistors 312, with the first transistors 402 coupled to a first power rail 202 that corresponds to the first voltage 302.

At block 1804, the first transistors of the first set of transistors are sequentially turned off. For example, the circuitry of the IC 110 may sequentially turn off the first transistors 402 of the first set of transistors 312.

In an example implementation, the sequentially turning off of the first transistors may include delaying a power rail selection signal that is propagating between consecutive ones of the first transistors. For instance, a power rail selection signal 602 that is propagating between a first transistor 402-1 of FIG. 15 and a consecutive first transistor 402-2 may be delayed by a buffer 1512.

At block 1806, after the first transistors are sequentially turned off, second transistors of a second set of transistors are sequentially turned on, with the second transistors coupled to a second power rail that corresponds to a second voltage. For example, the circuitry of the IC 110 may, after sequentially turning off the first transistors 402, sequentially turn on second transistors 404 of a second set of transistors 314, with the second transistors 404 coupled to a second power rail 204 that corresponds to a second voltage 304.

In an example implementation, a first transistor may correspond to a second transistor if both are disposed within a given power-mux tile or coupled to a same delay circuit. An operational state of a corresponding second transistor of the second set of transistors may be controlled based on a voltage that controls an operational state of a corresponding first transistor of the first set of transistors. For instance, an operational on or off state of a corresponding second transistor 404 of the second set of transistors 314 may be controlled based on a voltage that controls an operational on or off state of a corresponding first transistor 402 of the first set of transistors 312. More specifically, with reference to FIG. 10, an operational on or off state of a corresponding second transistor 404 may be controlled at least partially based on a voltage at the node 1094 that controls an operational on or off state of a corresponding first transistor 402 such that the corresponding first transistor 402 and the corresponding second transistor 404 are not both turned on together.

In another example implementation, the sequentially turning on of second transistors may include propagating a transistor operational state feedback signal between consecutive ones of the second transistors. For instance, a transistor operational state feedback signal 802 may be propagated between a second transistor 404-3 and a second transistor 404-2 that is operationally consecutive to the second transistor 404-3.

In another example implementation, the sequentially turning off of the first transistors may include sequentially turning off the first transistors in a first order, and the sequentially turning on of the second transistors may include sequentially turning on the second transistors in a second order, with the second order being a reverse of the first order. For instance, with reference to FIG. 4, the first transistors 402 of the first set of transistors 312 may be turned off from left to right, or from the power-mux tile 210-1 to the power-mux tile 210-4, and the second transistors 404 of the second set of transistors 314 may be turned on from right to left, or from the power-mux tile 210-4 to the power-mux tile 210-1.

At block 1808, power is supplied to the circuit load at the second voltage using the second transistors of the second set of transistors. For example, the circuitry of the IC 110 may supply power to the circuit load 208 at the second voltage 304 using the second transistors 404 of the second set of transistors 314.

In an example implementation, a process may be performed in a 3-to-1 power rail multiplexing environment. The second transistors of the second set of transistors may be sequentially turned off. After the second transistors are sequentially turned off, third transistors of a third set of transistors may be sequentially turned on, with the third transistors coupled to a third power rail that corresponds to a third voltage. Further, power may be supplied to the circuit load at the third voltage using the third transistors. For instance, after sequentially turning off the second transistors 404 of the second set of transistors 314, an IC 110 may sequentially turn on third transistors 1618 of a third set of transistors 1658, with the third transistors 1618 coupled to a third power rail 1628 that corresponds to a third voltage 1638. The IC 110 may further supply power to the circuit load 208 at the third voltage 1638 using the third transistors 1618.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   a first power rail;
   a second power rail;
   a load power rail;
   a first set of transistors including first transistors that are coupled between the first power rail and the load power rail, each first transistor disposed in one of multiple power-multiplexer tiles, the power-multiplexer tiles configured in a chained arrangement;
   a second set of transistors including second transistors that are coupled between the second power rail and the load power rail, each second transistor disposed in one of the power-multiplexer tiles; and
   power-multiplexer circuitry configured to switch access to power for the load power rail from the first power rail to the second power rail by sequentially turning off the first transistors of the first set of transistors in a first direction along the chained arrangement and then sequentially turning on the second transistors of the second set of transistors in a second direction along the chained arrangement, the second direction opposite the first direction, and configured to switch access to power for the load power rail from the second power rail to the first power rail by sequentially turning off the second transistors of the second set of transistors in the first direction along the chained arrangement and then sequentially turning on the first transistors of the first set of transistors in the second direction along the chained arrangement.

2. The integrated circuit of claim 1, wherein the power-multiplexer circuitry comprises self-timed circuitry.

3. The integrated circuit of claim 2, wherein an operational timing of the self-timed circuitry is independent of a periodic clock signal.

4. The integrated circuit of claim 2, wherein the self-timed circuitry comprises multiple circuit devices that have a joint operational timing that is based on an intrinsic speed of individual ones of the multiple circuit devices.

5. The integrated circuit of claim 1, wherein the power-multiplexer circuitry includes a configurable delay device that has an adjustable delay to control a delay between turning off one of the first transistors of the first set of transistors and turning off a sequentially next one of the first transistors of the first set of transistors.

6. The integrated circuit of claim 1, wherein at least a portion of the power-multiplexer circuitry is distributed across the chained arrangement of the multiple power-multiplexer tiles.

7. The integrated circuit of claim 1, wherein:
   the power-multiplexer circuitry includes a set of delay circuits; and
   a respective delay circuit of the set of delay circuits is coupled between a respective first transistor of the first set of transistors and a respective second transistor of the second set of transistors.

8. The integrated circuit of claim 7, wherein the respective delay circuit is configured to prevent the respective second transistor from being turned on until the respective first transistor is turned off.

9. The integrated circuit of claim 1, further comprising:
   a voltage detector:
      configured to detect a higher voltage between a first voltage corresponding to the first power rail and a second voltage corresponding to the second power rail; and
      configured to power at least part of the power-multiplexer circuitry using the higher voltage.

10. The integrated circuit of claim 1, further comprising:
    a third power rail; and
    a third set of transistors including third transistors that are coupled between the third power rail and the load power rail, each third transistor disposed in one of the multiple power-multiplexer tiles,
    wherein the power-multiplexer circuitry is further configured to switch access to power for the load power rail from the first power rail to the third power rail by sequentially turning off the first transistors and then sequentially turning on the third transistors.

11. The integrated circuit of claim 10, wherein the power-multiplexer circuitry includes a power rail selection decoder that is configured to decode a power rail selection signal, the power rail selection signal indicative of a power source for the load power rail.

12. An integrated circuit comprising:
    a first power rail;
    a second power rail;
    a load power rail;
    a first set of transistors including first transistors that are coupled between the first power rail and the load power rail, each first transistor disposed in one of multiple power-multiplexer tiles, the power-multiplexer tiles configured in a chained arrangement;
    a second set of transistors including second transistors that are coupled between the second power rail and the load power rail, each second transistor disposed in one of the power-multiplexer tiles; and means for switching access to power for the load power rail from the first power rail to the second power rail, including:
  means for sequentially turning off the first transistors of the first set of transistors in a first direction along the chained arrangement; and
  means for sequentially turning on the second transistors of the second set of transistors after the first transistors of the first set of transistors are off, the second transistors turned on in a second direction along the chained arrangement, the second direction opposite the first direction.

13. The integrated circuit of claim 12, wherein the means for switching access to power for the load power rail further includes means for decoding a power rail selection signal, which is indicative of a selected power source for the load power rail, to cause one transistor to be on and at least one transistor to be off per power-multiplexer tile of multiple power-multiplexer tiles.

14. The integrated circuit of claim 12, wherein:
  the means for switching access to power for the load power rail further includes means for propagating a power rail selection signal to the power-multiplexer tiles; and
  the means for sequentially turning off the first transistors is configured to operate responsive to the power rail selection signal.

15. The integrated circuit of claim 12, wherein:
  the means for switching access to power for the load power rail further includes means for propagating a transistor operational state feedback signal to the power-multiplexer tiles; and
  the means for sequentially turning on the second transistors is configured to operate responsive to the transistor operational state feedback signal.

16. The integrated circuit of claim 12, wherein:
  the first power rail corresponds to a first voltage;
  the second power rail corresponds to a second voltage; and
  the means for switching access to power for the load power rail comprises means for switching access to power for the load power rail from the first power rail to the second power rail independently of a voltage level differential between the first voltage and the second voltage.

17. The integrated circuit of claim 12, wherein the means for switching access to power for the load power rail further includes means for preventing a short-circuit current between the first power rail and the second power rail.

18. A method for power rail multiplexing in an integrated circuit, the method comprising:
  supplying power to a circuit load at a first voltage using first transistors of a first set of transistors, the first transistors coupled to a first power rail that corresponds to the first voltage, each first transistor disposed in one of multiple power-multiplexer tiles, the power-multiplexer tiles configured in a chained arrangement;
  sequentially turning off the first transistors of the first set of transistors, the first transistors turned off in a first direction along the chained arrangement;
  after sequentially turning off the first transistors, sequentially turning on second transistors of a second set of transistors, the second transistors coupled to a second power rail that corresponds to a second voltage, each second transistor disposed in one of the power-multiplexer tiles, the second transistors turned on in a second direction along the chained arrangement, the second direction opposite the first direction; and
  supplying power to the circuit load at the second voltage using the second transistors of the second set of transistors.

19. The method of claim 1, further comprising:
  sequentially turning off the second transistors of the second set of transistors, the second transistors turned off in the first direction along the chained arrangement;
  after sequentially turning off the second transistors, sequentially turning on third transistors of a third set of transistors, the third transistors coupled to a third power rail that corresponds to a third voltage, each third transistor disposed in one of the power-multiplexer tiles, the third transistors turned on in the second direction along the chained arrangement; and
  supplying power to the circuit load at the third voltage using the third transistors.

20. The method of claim 18, wherein the sequentially turning off the first transistors comprises delaying a power rail selection signal that is propagating between consecutive ones of the first transistors.

21. The method of claim 18, further comprising:
  controlling an operational state of a corresponding second transistor of the second set of transistors based on a voltage that controls an operational state of a corresponding first transistor of the first set of transistors.

22. The method of claim 18, wherein the sequentially turning on second transistors comprises propagating a transistor operational state feedback signal between consecutive ones of the second transistors.

23. An integrated circuit comprising:
  a circuit load;
  a first power rail;
  a second power rail;
  a load power rail that is coupled to the circuit load; and
  multiple power-multiplexer tiles, each power-multiplexer tile including a first transistor coupled between the first power rail and the load power rail and a second transistor coupled between the second power rail and the load power rail,
the multiple power-multiplexer tiles disposed in a chained arrangement and configured to propagate a selection signal between consecutive power-multiplexer tiles in a first direction along the chained arrangement to disconnect the first power rail or the second power rail from the load power rail and to propagate a feedback signal between consecutive power-multiplexer tiles in a second direction along the chained arrangement to connect the second power rail or the first power rail to the load power rail, the second direction opposite the first direction.

24. The integrated circuit of claim 23, wherein:
  the multiple power-multiplexer tiles are further configured to turn on the corresponding second transistor based on the first transistor having an OFF operational state and responsive to the feedback signal being indicative of an ON operational state of the consecutive second transistor.

* * * * *